(12) United States Patent
Tracewell et al.

(10) Patent No.: US 7,460,367 B2
(45) Date of Patent: Dec. 2, 2008

(54) METHOD AND SYSTEM FOR DISSIPATING THERMAL ENERGY FROM CONDUCTION-COOLED CIRCUIT CARD ASSEMBLIES WHICH EMPLOY REMOTE HEAT SINKS AND HEAT PIPE TECHNOLOGY

(75) Inventors: Matthew S. Tracewell, Powell, OH (US); Gary G. Chen, Lewis Center, OH (US)

(73) Assignee: Tracewell Systems, Inc., Columbus, OH (US)

( * ) Notice: Subject to any disclaimer, the term of this patent is extended or adjusted under 35 U.S.C. 154(b) by 31 days.

(21) Appl. No.: 11/713,970

(22) Filed: Mar. 5, 2007

(65) Prior Publication Data

US 2008/0218980 A1    Sep. 11, 2008

(51) Int. Cl.
*H05K 7/20* (2006.01)
*H01L 23/36* (2006.01)

(52) U.S. Cl. .................. 361/687; 361/700; 361/701; 165/80.4; 165/80.5; 165/104.21; 165/104.33; 62/259.2

(58) Field of Classification Search .......... 361/686, 361/687, 690–697, 702–712, 717–724, 727–732, 361/752, 756; 165/80.2, 80.3, 80.4, 80.5, 165/104.31, 104.32, 104.33, 104.34, 104.21, 165/139, 141, 185; 257/713–719, 722–727; 174/15.1, 16.1, 16.3, 50, 50.02; 62/259.2
See application file for complete search history.

(56) References Cited

U.S. PATENT DOCUMENTS

| | | | |
|---|---|---|---|
| 4,012,089 A | 3/1977 | Ward | |
| 4,315,300 A * | 2/1982 | Parmerlee et al. | 361/703 |
| 4,493,010 A * | 1/1985 | Morrison et al. | 361/698 |
| 4,963,833 A | 10/1990 | Mountz | |
| 5,329,425 A * | 7/1994 | Leyssens et al. | 361/701 |
| 5,825,621 A * | 10/1998 | Giannatto et al. | 361/701 |
| 5,842,514 A * | 12/1998 | Zapach et al. | 165/104.33 |
| 5,946,191 A | 8/1999 | Oyamada | |
| 6,166,908 A | 12/2000 | Samaras et al. | |
| 6,209,631 B1 * | 4/2001 | Garcia-Ortiz | 165/287 |
| 6,252,775 B1 * | 6/2001 | Kuroda | 361/707 |
| 6,310,772 B1 * | 10/2001 | Hutchison et al. | 361/700 |
| 6,388,882 B1 * | 5/2002 | Hoover et al. | 361/704 |
| 6,394,175 B1 | 5/2002 | Chen et al. | |
| 6,798,661 B1 | 9/2004 | Barsum et al. | |
| 6,804,117 B2 * | 10/2004 | Phillips et al. | 361/700 |
| 6,839,235 B2 | 1/2005 | St. Louis et al. | |
| 6,914,780 B1 | 7/2005 | Shanker et al. | |
| 6,972,365 B2 | 12/2005 | Garner | |
| 7,031,158 B2 * | 4/2006 | Leon et al. | 361/700 |

(Continued)

FOREIGN PATENT DOCUMENTS

JP    402155296 A  *  6/1990

(Continued)

*Primary Examiner*—Michael V Datskovskiy
(74) *Attorney, Agent, or Firm*—Mueller Smith

(57) ABSTRACT

Method and System for dissipating thermal energy from conduction-cooled circuit card assemblies in which thermal energy is directed into proximate heat sink assemblies and additionally is conveyed by heat pipes to one or more remote heat sink assemblies configured for the transfer of thermal energy to a flow of air and located within a chassis at a position remote from the system thermal load.

23 Claims, 19 Drawing Sheets

U.S. PATENT DOCUMENTS 7,345,877 B2 * 3/2008 Asfia et al. .................. 361/700

FOREIGN PATENT DOCUMENTS

| | | | | |
|---|---|---|---|---|
| JP | 406350278 A | * | 12/1994 | |
| JP | 411068370 A | * | 3/1999 | |
| JP | 02001024369 A | * | 1/2001 | |
| JP | 02002057481 A | * | 2/2002 | |

* cited by examiner

METHOD AND SYSTEM FOR DISSIPATING THERMAL ENERGY FROM CONDUCTION-COOLED CIRCUIT CARD ASSEMBLIES WHICH EMPLOY REMOTE HEAT SINKS AND HEAT PIPE TECHNOLOGY

CROSS-REFERENCE TO RELATED APPLICATIONS

STATEMENT REGARDING FEDERALLY SPONSORED RESEARCH

Not applicable.

BACKGROUND OF THE INVENTION

Industry and governmental entities have developed requirements for operating sophisticated electronics within harsh environments with extreme temperature, shock and vibration. For performing under these conditions, systems typically involve robust and sometimes sealed chassis assemblies which are called upon to perform with conduction-cooled circuit card assemblies (CCAs) or modules. These modules themselves are environmentally protected by enclosure within shell-like structures incorporating conduction frames or a three-dimensional conduction plate which conduct an electronically evolved heat energy to oppositely disposed sides or edge regions. When positioned within a chassis, the module engages a backplane as well as the oppositely disposed card slots or channels of robust thermally conductive conduction rails. The sides or edge regions of the modules are retained in substantial compression against the card slots by an expandable retaining device such as a wedge lock. With such compressive contact at the rail channels or slots, conductive heat transfer is provided from the modules into the conduction rail assemblies. These assemblies, in turn, are coupled in heat transfer relationship with chassis mounted finned heat sinks. As these thermal conduction-based systems evolved, so also did industry standards or specifications by organizations such as VITA (VME Industrial Trade Association). See for instance, IEEE Standard for Mechanical Core Specifications for Conduction-Cooled Eurocards (IEEE Std 1101.2-1992) concerning 6 U by 160 mm modules.

While the earlier conduction-based systems functioned adequately in carrying out heat dissipation, as electronic systems including power supplies have become more complex and functionally elaborate, heat generation at the modules has been seen to substantially increase and the conventional thermal conduction systems have been unable to perform adequately. Some conduction-cooled circuit card assembly installations are provided at locations having access to liquid cooling facilities which can be employed to accommodate the higher heat loads now being encountered. However, such facilities may be vulnerable to harsh environments, or may not be available or acceptable for a variety of reasons. For instance, if liquid cooling facilities are not already available on a given platform, designers will not wish to add them. Industrial entities engaged in developing the air flow-based conduction-cooled circuit card assemblies have resorted to such regressive design approaches as depopulating card carrying components, lowering clock speeds and the like to ameliorate the problem.

The inadequacies of the conventional approaches also have imposed limitations on the capability of retrofitting 20 or 25 year old platforms, for example, located in aircraft, with modern electronic systems.

SUMMARY

The present disclosure is addressed to a system and method for dissipating thermal energy from an assemblage of conduction-cooled circuit card assemblages into flowing air. A principal handling of the heat load developed by conductive thermal energy transfer from the assemblage of circuit card assemblies to card slots containing conduction rail assemblies is by an essentially direct conduction coupling of these rail assemblies to finned heat sinks. These heat sinks are arbitrarily designated herein as "proximate" heat sinks. For the higher thermal loads now contemplated, most of these proximate heat sinks associated with a given chassis will be unable to dissipate the encountered thermal load to flowing air. Such heat dissipation capacity of the proximate heat sinks is computed so that a remaining thermal load portion not dissipated may also be computed. In general, this remaining thermal load portion is very rapidly transferred to a remote heat sink supported by a chassis at a location generally without the influence of heat transferred to the conduction rail assemblies. To accomplish a very rapid thermal energy transfer, heat pipe technology is employed. In this regard, the thermal energy receiving portions of the heat pipes are thermally engaged with the conduction rail assemblies and extend to thermal energy transferring association with the one or more remote heat sinks.

The method generally involved in developing the instant system comprises a determination of geometric limiting dimensions required for a chassis carrying the assemblage of conduction-cooled circuit card assemblies. Based upon a sequence of parameters, for instance, developed by the designers and fabricators of the conduction-cooled circuit card assemblies, the method determines an optimized proximate heat sink structure and its capabilities for optimally dissipating all or a portion of the anticipated thermal load. Such parameters will comprise, for example, pitch, theoretical air velocity, air pressure, air-to-rail differential temperature, and an optimal fin length, height and density. Any alteration of these parameters will result in a lessoning of the thermal energy dissipating capability of the heat sink and, in general, the designer will alter one or more of the optimized proximate heat sink structures to conform to the requirements of the geometric limiting dimensions of an anticipated chassis. Accordingly, the method involves determining the thermal energy dissipating capability of the altered proximate heat sink structures and the remaining thermal load portion not dissipated by these proximate structures. Then, one or more remote heat sink assemblies are configured to dissipate at least the remaining thermal load.

The method at hand permits a substantial design flexibility in developing system architectures. For instance, in one embodiment, the chassis is configured with oppositely disposed sides extending between end portions and including a bottom region and a top region. The backplane for this arrangement is supported at the bottom region and one or more of the remote heat sink assemblies are mounted within the chassis generally below that backplane. With this structuring, the chassis may define an air flow path extending between the top region across the one or more proximate heat sink assemblies and across the one or more remote heat sink assemblies as well as the chassis fin portion. Where the pitch or spacing between circuit card assemblies is adequate, the heat pipes may be embedded within the conduction rail structure and bent to remain internal and extend to the remote one or more heat sinks. A particular advantage of the system is a lessoning of the number of air flow driving fans. For example, two such fans may be adequate with a third permitting operation of the system at altitudes of 10,000 feet.

For a similar architecture but with a shorter pitch or card-to-card spacing there is insufficient room for embedding heat pipes within the internal conductive rail structure. Accordingly, each heat pipe is then mounted in thermal energy transfer relationship at an outwardly disposed surface of the assemblage of conduction rail assemblies. The heat pipes then are bent inwardly to gain access to the one or more remote heat sinks located below the backplane.

In another chassis architecture the chassis is configured having oppositely disposed sides extending between front and rear portions and is further configured with top and bottom portions. With this arrangement, a backplane is disposed centrally adjacent the rear portion of the chassis and is spaced from the side portions. An assemblage of oppositely disposed conduction rail assemblies is located at the top and bottom portions in general alignment with the backplane and one or more proximate heat sink assemblies are located centrally in general alignment with the conduction rail assemblies. With this arrangement, the one or more remote heat sink assemblies are located at the chassis top and bottom portions in general adjacency with the proximate heat sinks and heat pipes extend laterally outwardly from the proximate heat sinks and into the remote heat sinks. With this arrangement, the chassis is configured to define an air flow path extending between the front portion, across the proximate and remote heat sink assemblies and the rear portion. A fan assemblage may be supported at the rear portion in air flow communication with that air flow path.

Where a desired chassis architecture is, for instance, under severe widthwise constraint, the proximate heat sink assemblies may be eliminated while the length of the chassis may be expanded through the utilization of one or more remote heat sinks extending from the rear portion of the chassis.

Other objects will, in part, be obvious and will, in part, appear hereinafter.

The disclosure, accordingly, comprises the method and system possessing the construction, combination of elements, arrangement of parts and steps which are exemplified in the following detailed description.

For a fuller understanding of the nature and objects hereof, reference should be made to the following detailed description taken in connection with the accompanying drawings.

DETAILED DESCRIPTION

In the discourse to follow a conduction-cooled circuit card assembly (CCA) as described, for instance, in the above referenced IEEE Standard is disclosed, whereupon the approach by which the method and system set forth herein evolved is discussed. The description then turns to a discussion of heat pipe technology whereupon a chassis carrying 21 CCAs and the conduction-cooling approach of the disclosure is described. Other chassis architectures then are described.

Figure 1:
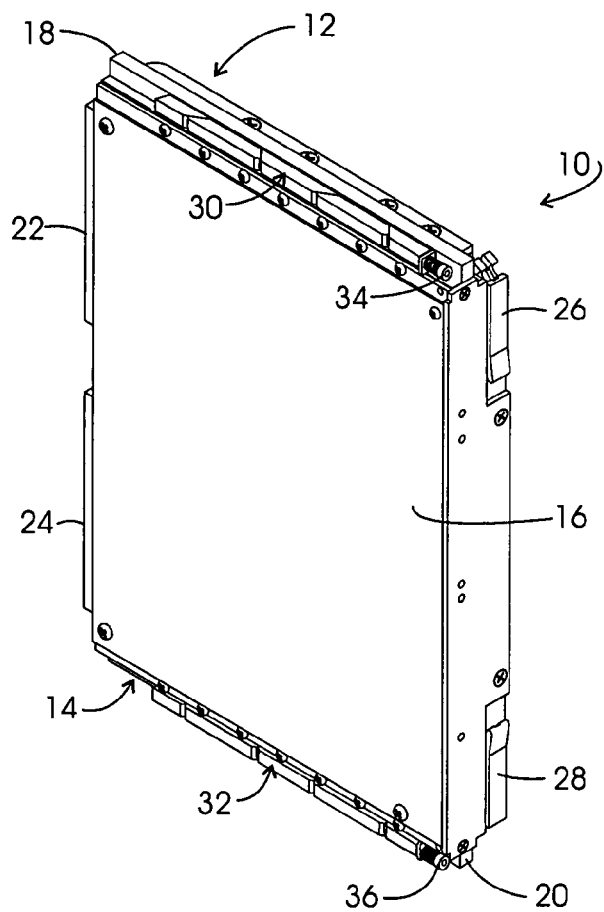
FIG. 1 is a perspective view of a conduction-cooled circuit card assembly.

Looking to FIG. 1, a conduction-cooled Eurocard (CCA) is represented generally at 10. CCA 10 is configured with a double-height or 6 U, nominal×160 mm format functioning to carry heat from a component carrying printed wiring board (PWB) to oppositely disposed edge regions represented generally at 12 and 14. Device 10 is formed with a metal plane with a conductive heat management layer or component 16. Management layer 16 performs in conjunction with optional stiffening ribs and heat transferring connectors 18 and 20 configured for insertion within a card slot. Card connectors are shown at 22 and 24 which are configured for mating association with connectors of a backplane. At the opposite end of the device 10 there are shown two ejectors 26 and 28. To assure rigid mechanical association and optimized thermal conduction with a chassis mounted conduction rail assembly, an expandable retainer implemented as a wedge lock is provided as represented generally at 30 and 32. Devices 30 and 32 are actuated by a bolt arrangement, the heads of which are shown respectively at 34 and 36.

Figure 2:
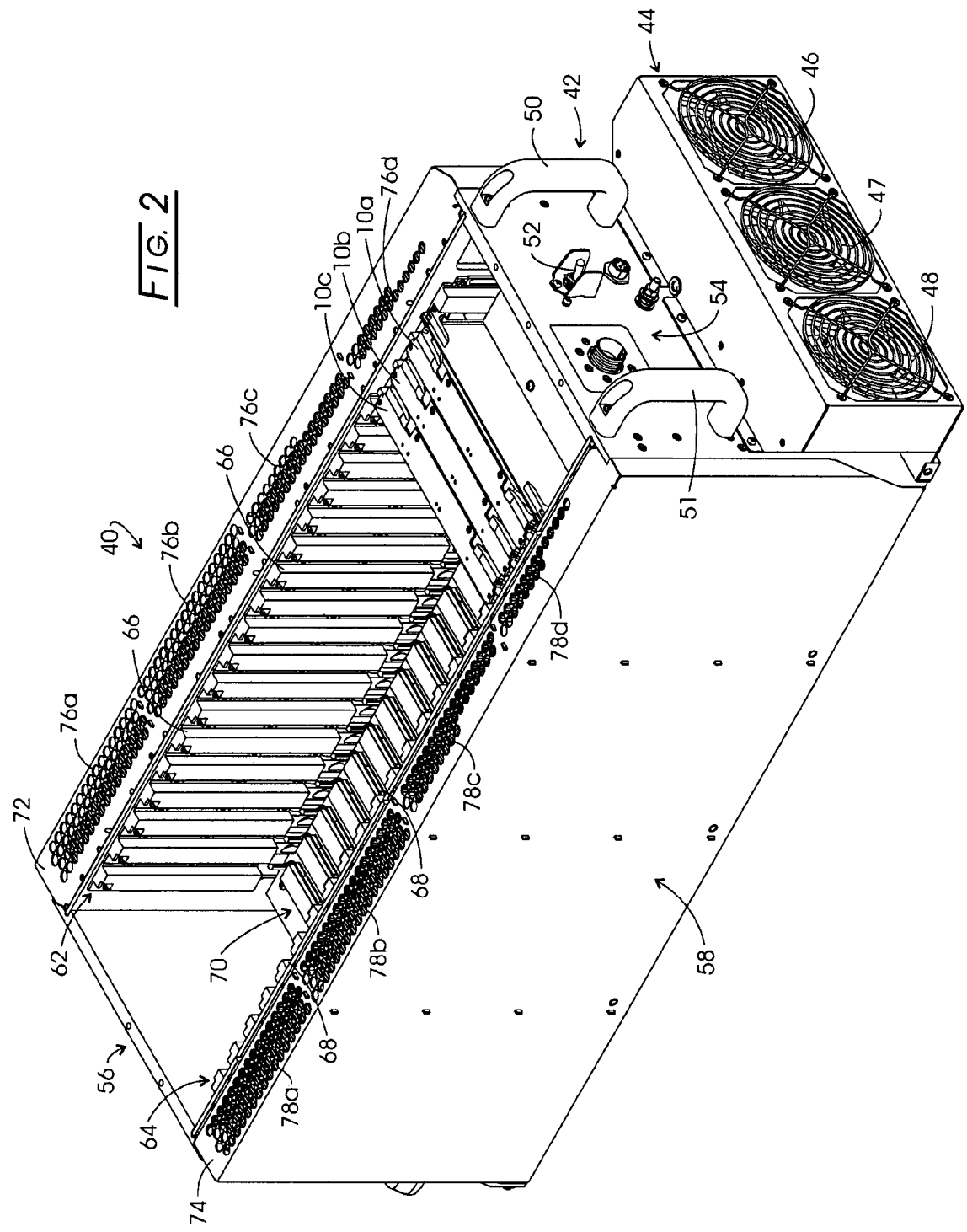
FIG. 2 is a perspective view of a chassis incorporating remote heat sink and heat pipe technology, the top cover being removed to reveal internal structure.

In the following discourse concerning the method at hand, an example is utilized wherein a chassis capable of operationally supporting twenty-one of the CCAs as at 10 is disclosed. This system was called upon to be designed to dissipate thermal energy representing 140 watts for each CCA as at 10. Following its design, the resultant chassis appeared as shown in general at 40 in FIG. 2. In that figure, the chassis front is shown in general at 42 supporting a fan mount represented generally at 44 retaining three air flow inducing fans 46-48, handgrips 50 and 51, a switch 52 and input/output (I/O)

components represented in general at 54. The rear portion of the chassis 40 is represented in general at 56 and one of its two sides is shown in general at 58 extending between the front portion 42 and rear portion 56. The chassis 40 is shown with its top cover removed. An assemblage of oppositely disposed conduction rail assemblies reveals one such assembly identified in general at 62 and portions of another such assembly are identified in general at 64. Each of the conduction rail assemblies 62 and 64 is configured with card slots functioning to receive the edge regions with heat transferring contact of CCAs as at 18 and 20 for both mechanical support and the conduction of heat into immediately adjacent proximate finned heat sinks (not shown). Certain of these card slots are shown at 66 in connection with assembly 62 and at 68 in connection with assembly 64. A backplane is represented generally at 70 carrying upwardly disposed backplane connectors located with respect to the card slots as at 66 and 68. Three CCAs as described at 10 in FIG. 1 are represented at 10a-10c. Thermal energy conveyed into the assemblies 66 and 68 from such CCAs is conducted to proximate nearest or next in space finned heat sinks (not shown) located in an air flow path partially defined by side portions as at 58 and oppositely disposed air inlet defining top components as at 72 and 74. These proximate finned heat sinks are associated with an air flow path which commences at orifice groupings 76a-76d in top component 72 and at orifice groupings 78a-78d located in top component 74.

Figure 3:
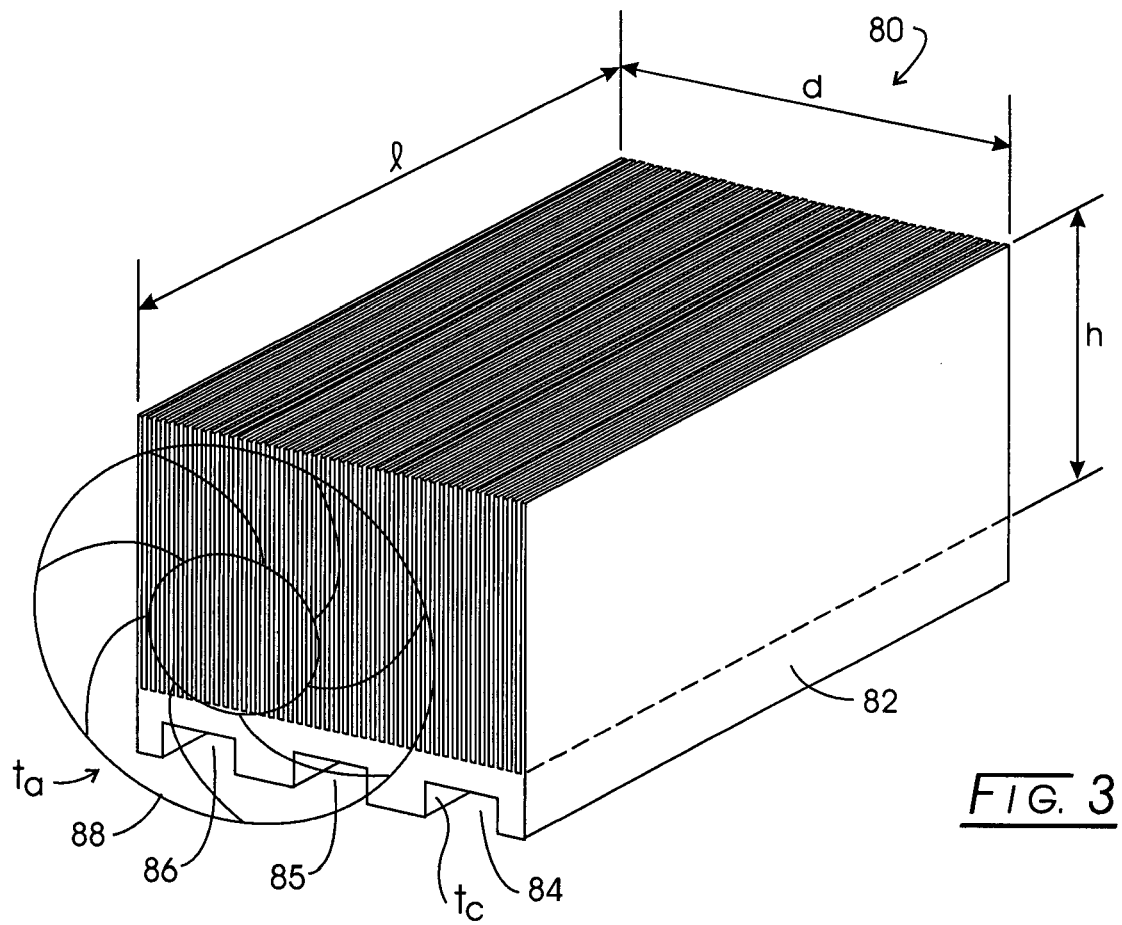
FIG. 3 is a schematic representation of an idealized heat sink having an idealized air flow and associated with three card slots of a conduction rail assembly.

In developing the method at hand, a designer and manufacturer of CCAs as at 10 established a thermal energy dissipation requirement equivalent to 140 watts per card, the cards being the 6 U×160 mm type described at 10 in FIG. 1. It was determined to develop a maximum boundary condition model wherein a finned proximal heat sink would extend over an adjacent three card slots of a conduction rail assembly and would provide the parameters for heat dissipation which cannot be improved. One parameter considered in connection with this bounding model is card pitch, the standard VITA card pitches being 0.8 inch, 1.2 inch and 1.4 inch. For the instant demonstration, a pitch of 1.2 inches was requested. Next, air velocity over the finned heat sink of 1000 linear feet per minute (LFM) evolved, any increase in velocity providing negligible additional cooling. An air pressure of 0.46 inches of water was called for which is achievable with high pressure fans. Air temperature versus rail temperature or temperature differential of 20° C. was requested and the maximized model would exhibit a maximum fin length, a maximum fin height and a maximum fin density. Any changes in these parameters will result in a degradation of performance. Looking to FIG. 3, a schematic representation of this idealized heat sink is represented generally at 80. This optimized heat sink 80 is shown having been developed with respect to a conduction rail assembly 82 incorporating three card slots, 84-86. Optimized heat sink 80 is shown having optimal or ideal fin length, l, and an optimal fin height, h. The optimal fin density is represented as, d, and the optimal air velocity of 1000 linear feet per minute is represented by the large symbolic fan 88. Because of the practical constraints of fan technology, the idealized air flow is not attainable from a practical standpoint. Symbol 88 also is representative of the noted air pressure of slightly less than one half inch of water. Rail temperature is represented as, $t_r$, while air temperature is represented as, $t_a$, it being recalled that a 20° C. differential in temperature was being called for.

Figure 4:
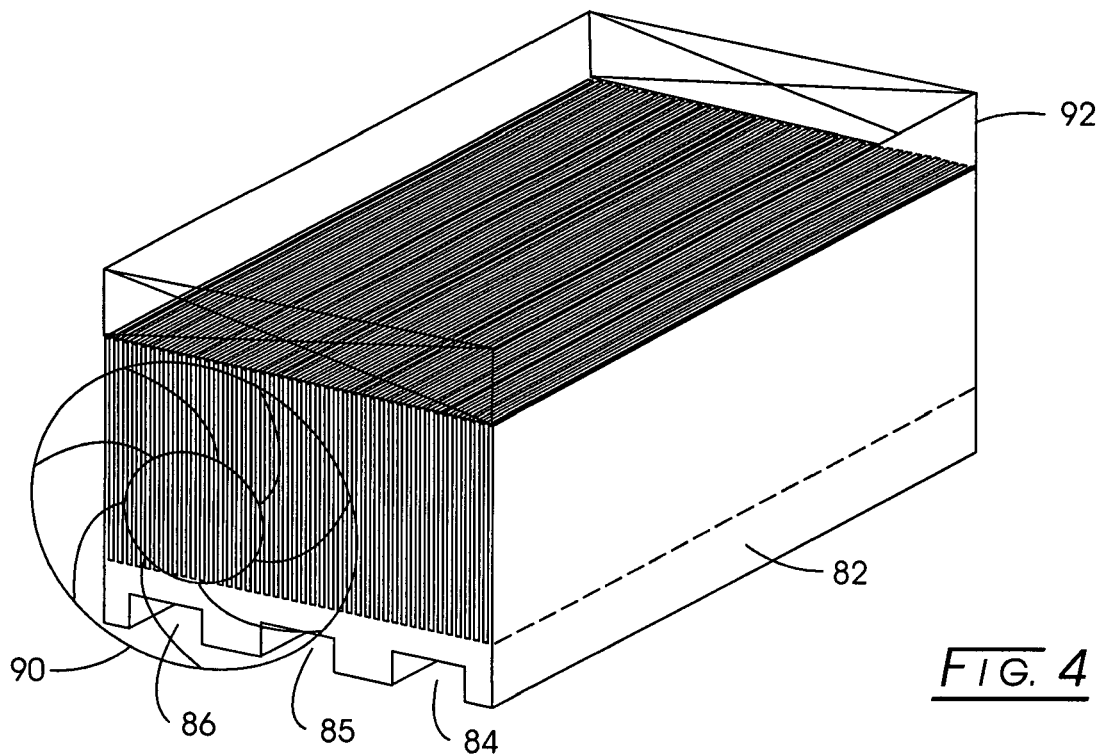
FIG. 4 is a modification of the idealized heat sink of FIG. 3 illustrating a practical fan-based air flow approach.

Recalling that the air flow criteria set forth above is impractical, an initial restriction is imposed on this idealized heat sink design. Accordingly, looking to FIG. 4, conduction rail assembly 82 is reproduced in conjunction with card slots 84-86. It was determined that a fan model number M35291 92 mm×38 mm high pressure/high velocity device marketed by Nidec America Corporation of Norwood Mass. would provide the best available performance. That fan is represented at 90 and its use may be considered to produce an air restrictor represented by the geometry at 92 which, by necessity, degrades the performance otherwise available from an optimized heat sink. Employing such a fan in conjunction with a three card slot component of a conduction rail assembly, for the 21 slot structure described in FIG. 2 would require a total of 14 fans, a highly undesirable configuration which additionally would not meet the heat dissipation requirements set forth by the CCA designer and manufacturer. The card cooling capacity both theoretical and "Real Fan" as described in FIG. 4 is set forth in Table 1 for a 1.2 inch pitch.

TABLE 1

| CCA(W) | |
|---|---|
| Theoretical | Real Fan |
| 164 | 136 |

Note in Table 1 that the available heat dissipation utilizing the "Real-Fan" shows the capability of dissipating 136 watts. That, of course, is insufficient for a 140 watt requirement. However, note that with an idealized heat sink, the 140 watt requirement is met.

Figure 5:
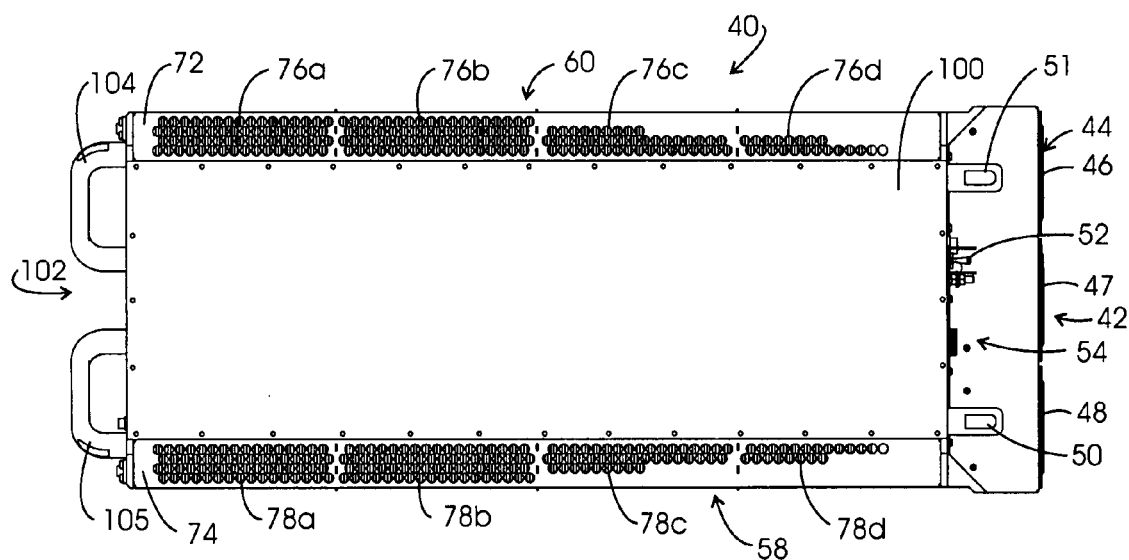
FIG. 5 is a top view of the chassis of FIG. 2.

With the proximate heat sink capability having been bounded with the idealized or maximized model, the method at hand is one which corrects or accommodates for the incapacity of the proximate heat sinks to dissipate to flowing air the thermal load conductively transferred to it. This accommodation is made through the provision of one or more remote heat sink assemblies configured for the transfer of thermal energy to a flow of air and supported by the chassis at a location remote from the thermal load. When so positioned, thermal energy must be transferred to the remote heat sink in as rapid and as efficient manner as possible. The architecture for this remote heat sink technology will vary with respect to the particular chassis and conduction-cooled card slot assemblage involved. Accordingly, the structure of the chassis 40 is now reviewed in more detail, following which the positioning of the remote heat sink and the technique of transferring thermal energy to it are explored. Looking to FIG. 5, a top view of the chassis 40 is presented, the view showing chassis side portion 60 in addition to side portion 58. The chassis is shown to be enclosed with a top cover 100. FIG. 5 also reveals a rear portion generally at 102 which incorporates mutually angularly disposed handles 104 and 105.

Figure 6:
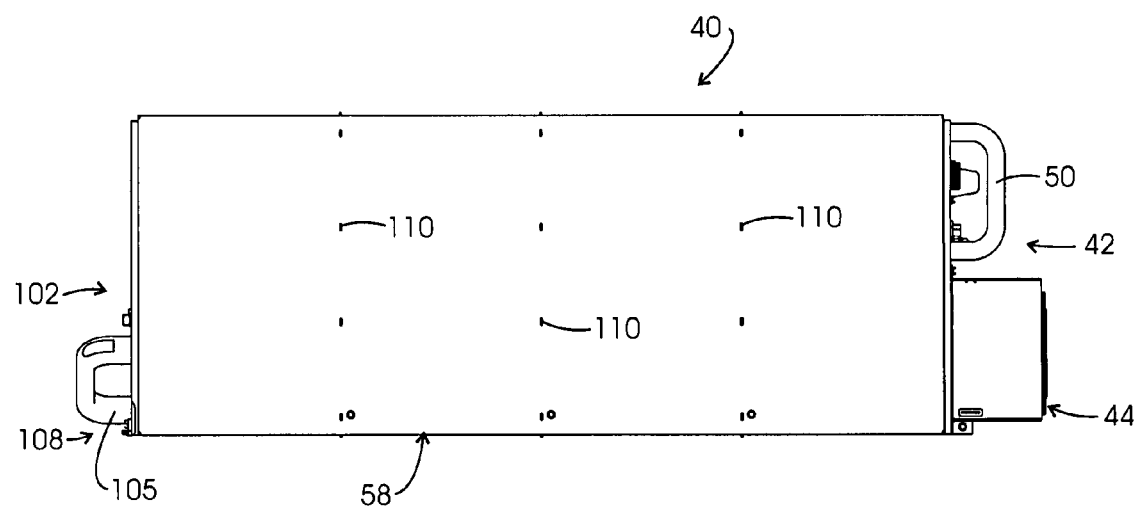
FIG. 6 is a left side view of the chassis of FIG. 5.

FIG. 6 reveals a left side view of chassis 40 showing a lower region represented generally at 108 and the presence of a number of tabs protruding through the surface of a side housing at portion 58, certain of which are identified at 110. These tabs will be seen to be components of a bracket structure.

Figure 7:
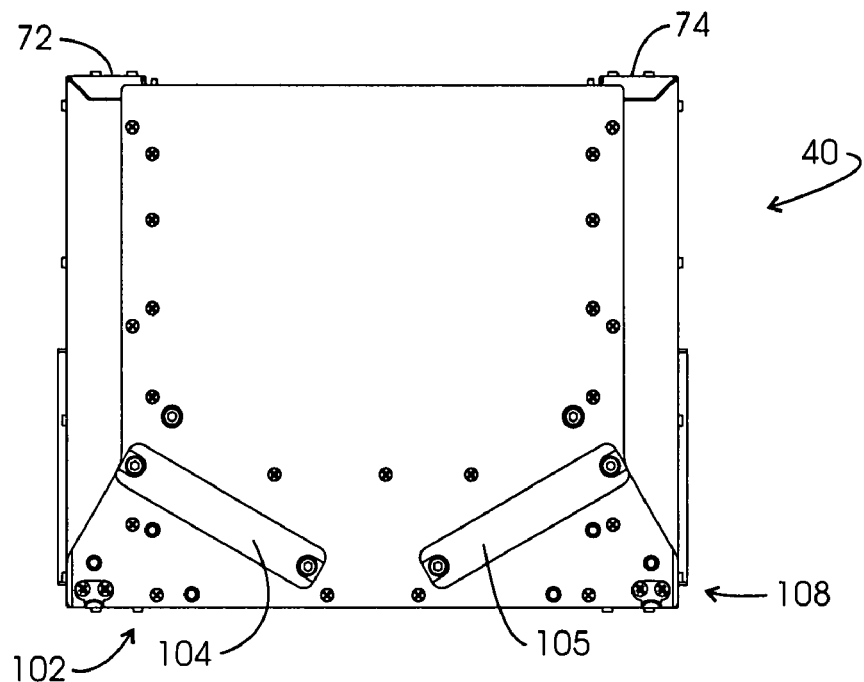
FIG. 7 is a rear view of the chassis of FIG. 2.

FIG. 7 reveals a rear view of chassis 40 shown without the installation of top cover 100. Lower region 108 again is identified.

Figure 8:
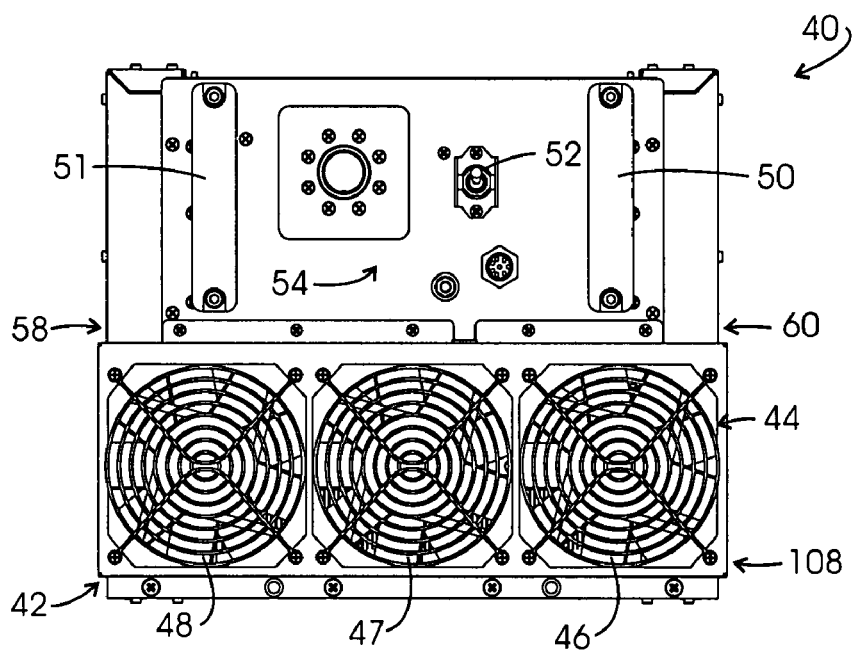
FIG. 8 is a front view of the chassis of FIG. 2.

FIG. 8 is a front view of the chassis 40 shown without top cover 100 and revealing the lower region 108.

Figure 9:
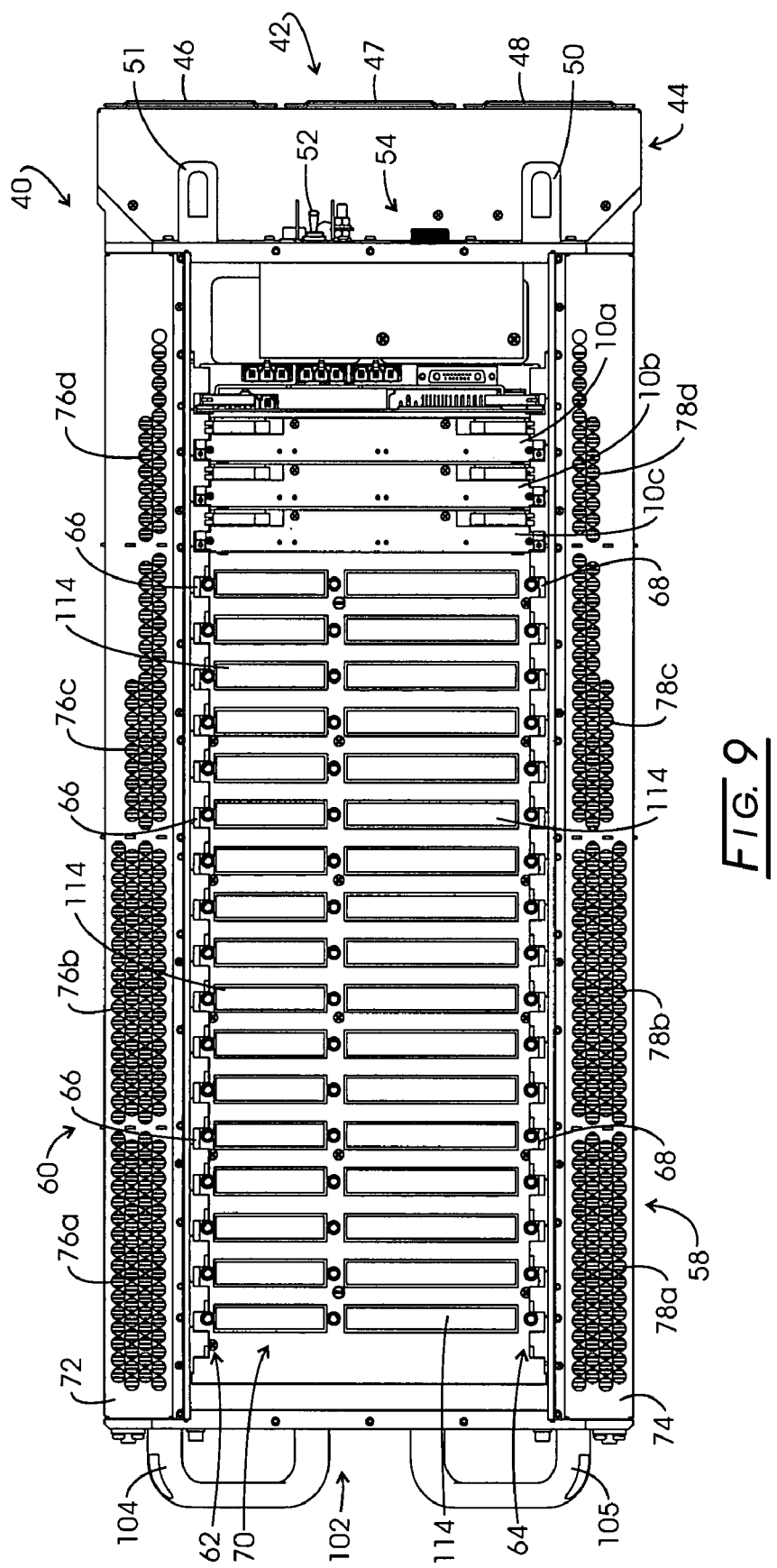
FIG. 9 is a top view of the chassis of FIG. 2.

Referring to FIG. 9, a top view of the chassis 40 is presented showing the oppositely disposed conduction rail assemblies 62 and 64 as well as the upwardly disposed surface of backplane 70. Note in this regard that backplane connectors extend upwardly for engagement with CCAs as again revealed at 10a-10c. These connectors are positioned so as to engage the connectors of the CCAs as those CCAs are, in turn, compressibly engaged within card slots, certain of which are identified again at 64 and 66.

Figure 10:
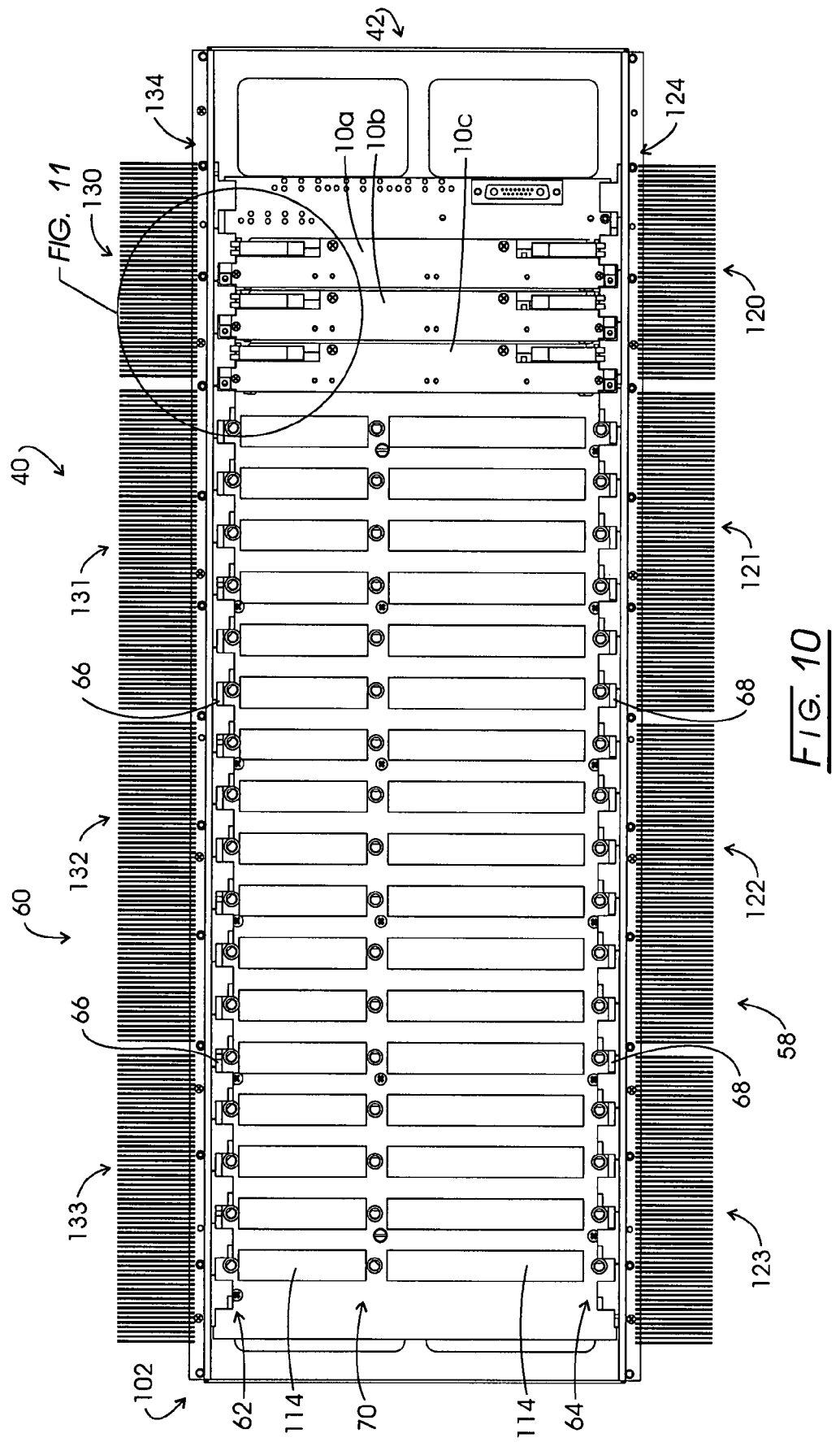
FIG. 10 is a top view of the chassis of FIG. 9 with removal of housing components to reveal internal structure.

Looking to FIG. 10, a top view of chassis 40 is presented with the removal of the front and rear covers as well as air path defining outer housing members or sheets. Backplane 70 is illustrated without its upstanding backplane connectors and conduction rail assemblies 62 and 64 are illustrated showing card slots 66 and 68. In the figure, finned proximate heat sinks are represented generally at 120-123 at side portion 58. The fins of these heat sinks 120-123 are thermally and mechanically coupled to a thermally conductive billet 124 with a thermally conductive adhesive. It further may be observed that conduction rail assembly 64 is coupled in thermal exchange relationship with billet 124. In similar fashion, finned proximate heat sinks 130-133 are located at side region 60 of chassis 40. The fin components of heat sinks 130-133 are coupled in thermal transfer relationship with a thermally conductive billet 134. Billet 134, in turn, is in thermal transfer contact relationship with conduction rail assembly 62.

Figure 11:
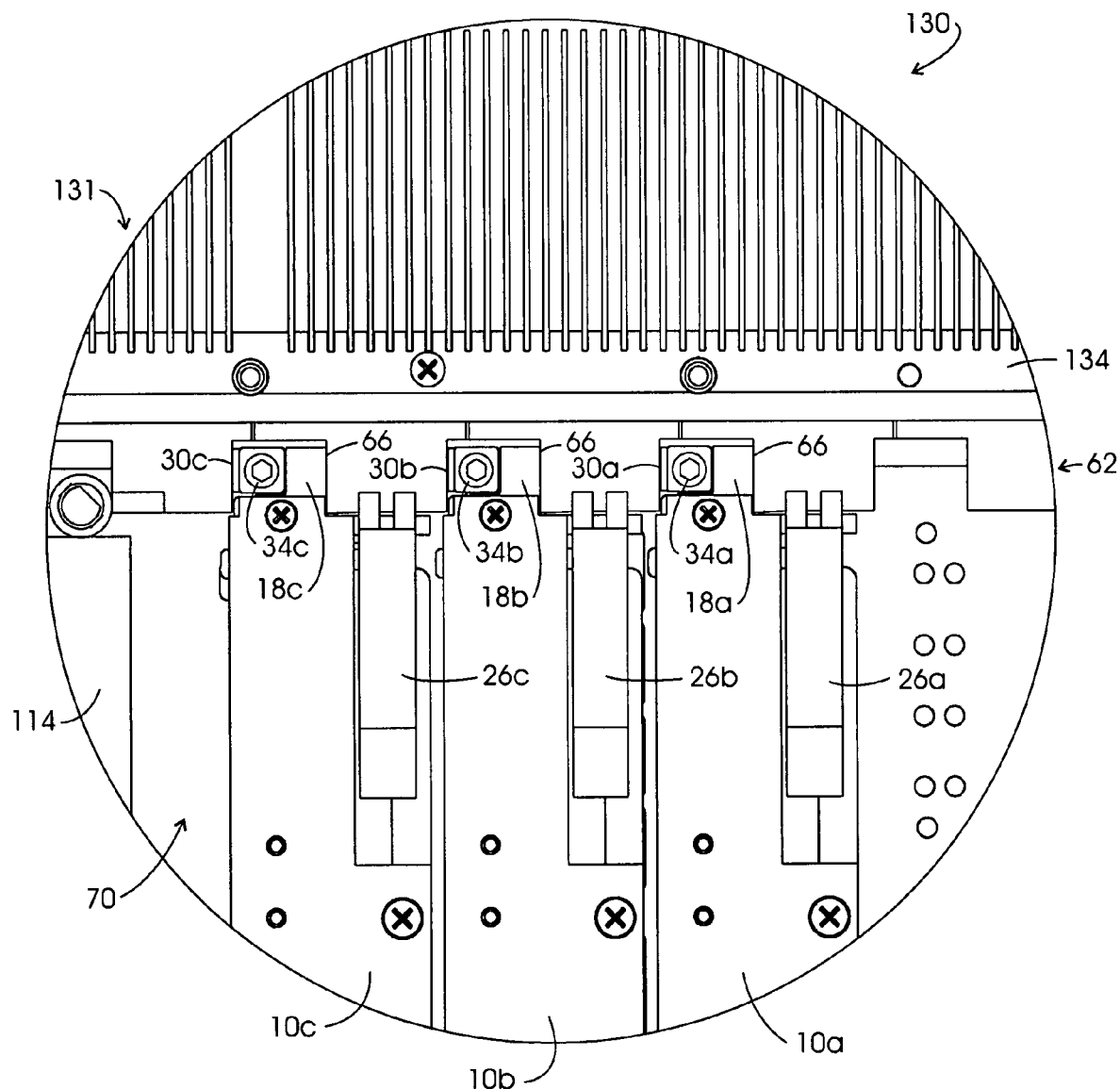
FIG. 11 is an enlarged view of the circular boundary shown in FIG. 10.

Looking to FIG. 11, an enlargement of the encircled region shown in FIG. 10 is presented. In the figure, portions of proximate heat sinks 130-131 are shown in conjunction with associated with billet 134. The heat transferring connector components of each of the CCAs are revealed in 18a-18c compressibly engaged with one surface of card guide slot 66 of conduction rail assembly 62. This compression is provided by wedge locks identified 30a-30c. With this arrangement, most of the thermal energy is transferred at the direct compressive connection between heat transferring components 18a-18c and one side of a card guide slot 66. Some such thermal energy will be transferred through wedge locks 30a-30c.

Figure 12:
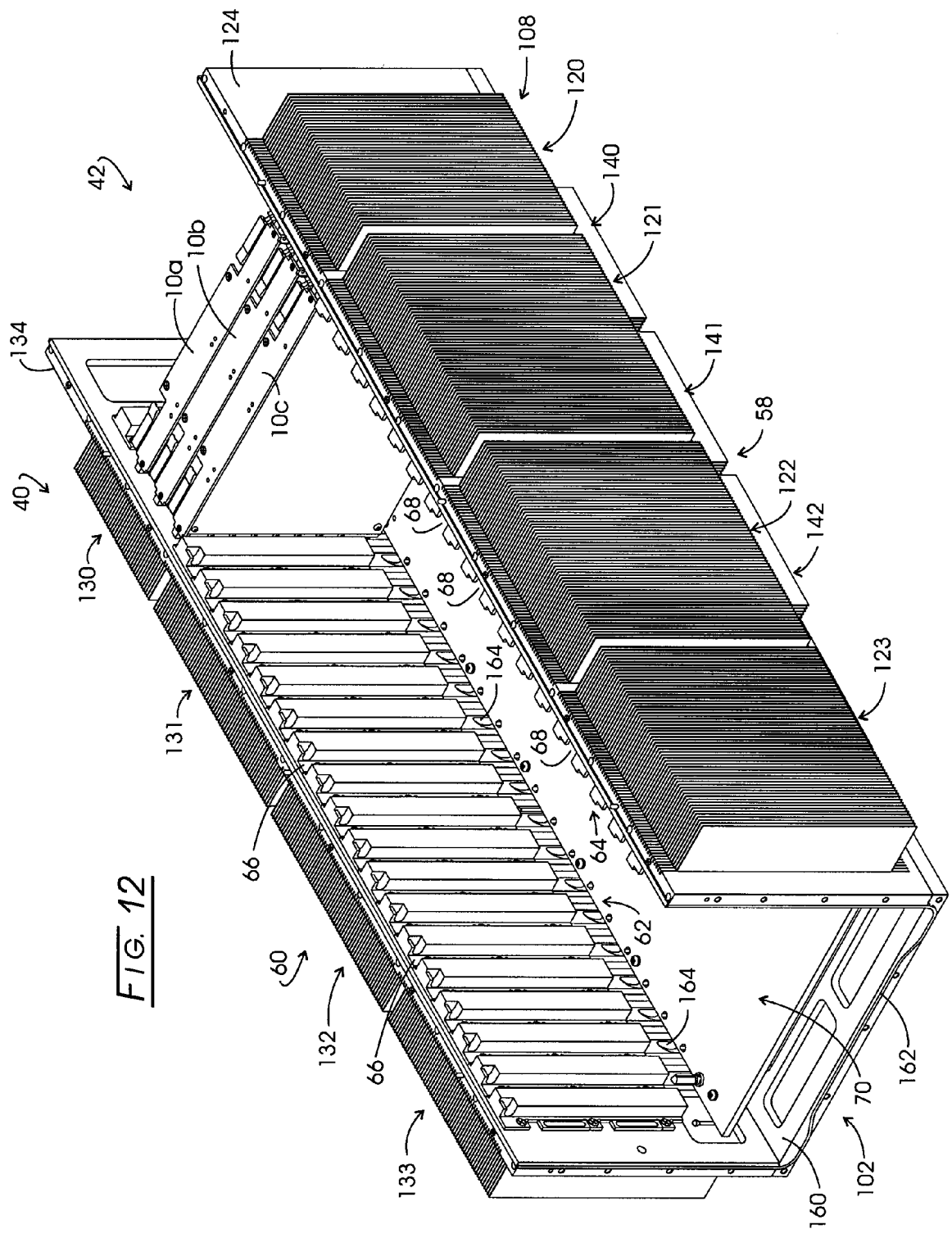
FIG. 12 is a perspective view of the chassis of FIG. 10.

Referring to FIG. 12, components of the chassis 40 illustrated in connection with FIG. 10 again are revealed in conjunction with a backplane 70. Backplane connectors are not shown in the interest of clarity. In the figure, proximate heat sinks 120-123 again are shown in mechanical and thermal exchange association with billet 124, while proximate heat sinks 130-133 are shown in mechanical and thermal exchange association with billet 134. The figure also reveals remote heat sinks 140-142 which are located beneath the backplane 70. Five such remote heat sinks will be seen to be so positioned and the technique for rapidly transferring thermal energy to these remote heat sinks from the conduction rail assemblies 62 and 64 utilizes heat pipe technology.

A heat pipe is a device that can very quickly transfer heat from one point to another. They are often referred to as super thermal conductors providing highly efficient heat transfer capacity and rate with almost no heat loss. While the idea of heat pipes was suggested as early as 1942, a practical development of heat pipes using capillary action occurred in about 1962 under the direction of G. Grover at Los Alamos National Laboratory. These devices have been commercially available since the mid 1970s.

Figure 13:
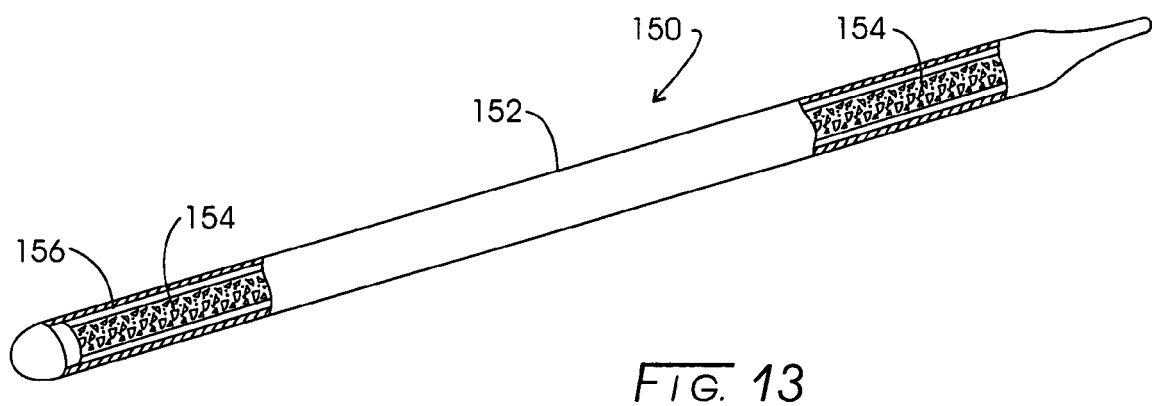
FIG. 13 is a schematic representation of a heat pipe with portions broken away to reveal internal structure.

Looking to FIG. 13, a typical heat pipe is illustrated in general at 150. Such a heat pipe consists of a sealed hollow tube, working fluid and wick structure. A thermally conductive metal such as copper or aluminum is used to make the tube, here represented at 152. Pipe 152 contains a relatively small quantity of working fluid or coolant, the remainder of the pipe being filled with vapor phase of working fluid, all other gases being excluded. Such vapor phase is represented at 154. Additionally, on the internal side of the tube 152 side walls, a wick structure exerts a capillary force on the liquid phase of the working fluid. Such a wick structure is represented at 156. These structures as at 156 are typically a sintered metal powder or a series of grooves parallel to the tube axis, however, the structure may be any material capable of soaking up the coolants.

Heat pipes employ evaporative cooling to transfer thermal energy from one point to another by the evaporation and condensation of a working fluid. When one end of the heat pipe is heated, the working fluid inside the pipe at that end evaporates and increases the vapor pressure inside the cavity of the heat pipe. The vapor pressure over the hot liquid working fluid at the hot end of the pipe is higher than the equilibrium vapor pressure over condensing working fluid at the cooler end of the pipe where a heat sink may be associated as will be shown in the discourse to follow. The pressure difference drives a rapid mass transfer to the condensing end where the excess vapor releases its latent heat, warming the cool end of the pipe. The condensed working fluid then simply flows back to the hot end of the pipe by capillary action.

The working fluid and wick structure chosen by the designer depends upon the temperature conditions under which the heat pipe must operate, with working fluids ranging from liquid helium for extremely low temperature applications to mercury for high temperature conditions. Other suitable fluids for working liquid include nitrogen, ammonia, acetone, methanol, ethanol, water, toluene, sodium and lithium. The majority of heat pipes use either ammonia or water as the working fluid.

The prime purpose of the wick is to generate capillary pressure to transport the working fluid from the condenser to the evaporator. It must also be able to distribute the liquid around the evaporator section to any area where heat is likely to be received by the heat pipe. Selection of the wick for a heat pipe depends on many factors, several of which are closely linked to the properties of the working fluid. The most common types of wicks include sintered powder, grooved tube, screen mesh and fiber spring. Maximum capillary head generated by a wick increases with a decrease in pore size. Another feature of the wick requiring optimization is its thickness. The heat transport capability of a heat pipe is raised by increasing the wick thickness. Overall thermal resistance at the evaporator also depends on the conductivity wettability of the working fluid in the wick.

Performance of a heat pipe under specific orientations is directly related to its wick structure. For example, the groove wick has the lowest capillary limit but works best under gravity-assisted conditions where the evaporator is located below the condenser. In the case of vertically oriented heat pipes, fluid movement is by the force of gravity and the working fluid simply drips back to the heat source. To overcome this limitation, commercially available heat pipes do not rely on gravity alone to move the fluid back to the heat source. Advantage is taken of the capillary action and the ability to transport heat against gravity by an evaporation-condensation cycle with the help of porous capillary provided by the wick. Sintered powder capillary structures create the strongest capillary action. With respect to concern about the possibility of the fluid from a heat pipe leaking into electronics, the amount of fluid in a heat pipe normally is less than 0.03 ounce. In a properly designed heat pipe, the fluid is totally contained within the capillary wick structure. Since the pressure inside the heat pipe is less than one atmosphere of pressure, if the integrity of the heat pipe vessel were ever compromised, air would lead into the heat pipe instead of the water leaking out. Then the fluid would slowly vaporize as it reaches its atmospheric boiling point. For heat pipes made of copper tube combined with a deionized water working fluid, the mean time to failure is estimated to be over 220,000 hours (about 25 years) of use.

Heat pipes have an effective thermal conductivity, more than thirty times that of copper. Heat flows of more than 230 MW/m$^2$ have been recorded.

For additional information concerning heat pipe technology, reference is made to the following publications:

(1) Chi, S. W, Heat Pipe Theory and Practice: A Sourcebook, Series in Thermal and Fluids Eng, Hemisphere Pub. Corp., Washington, 1976.

(2) Peterson, G. P., An Introduction to Heat Pipes: Modeling, Testing and Applications, Ser. in Thermal Mgt. of Electronics Sys., Wiley, N.Y., 1994.

Figure 14:
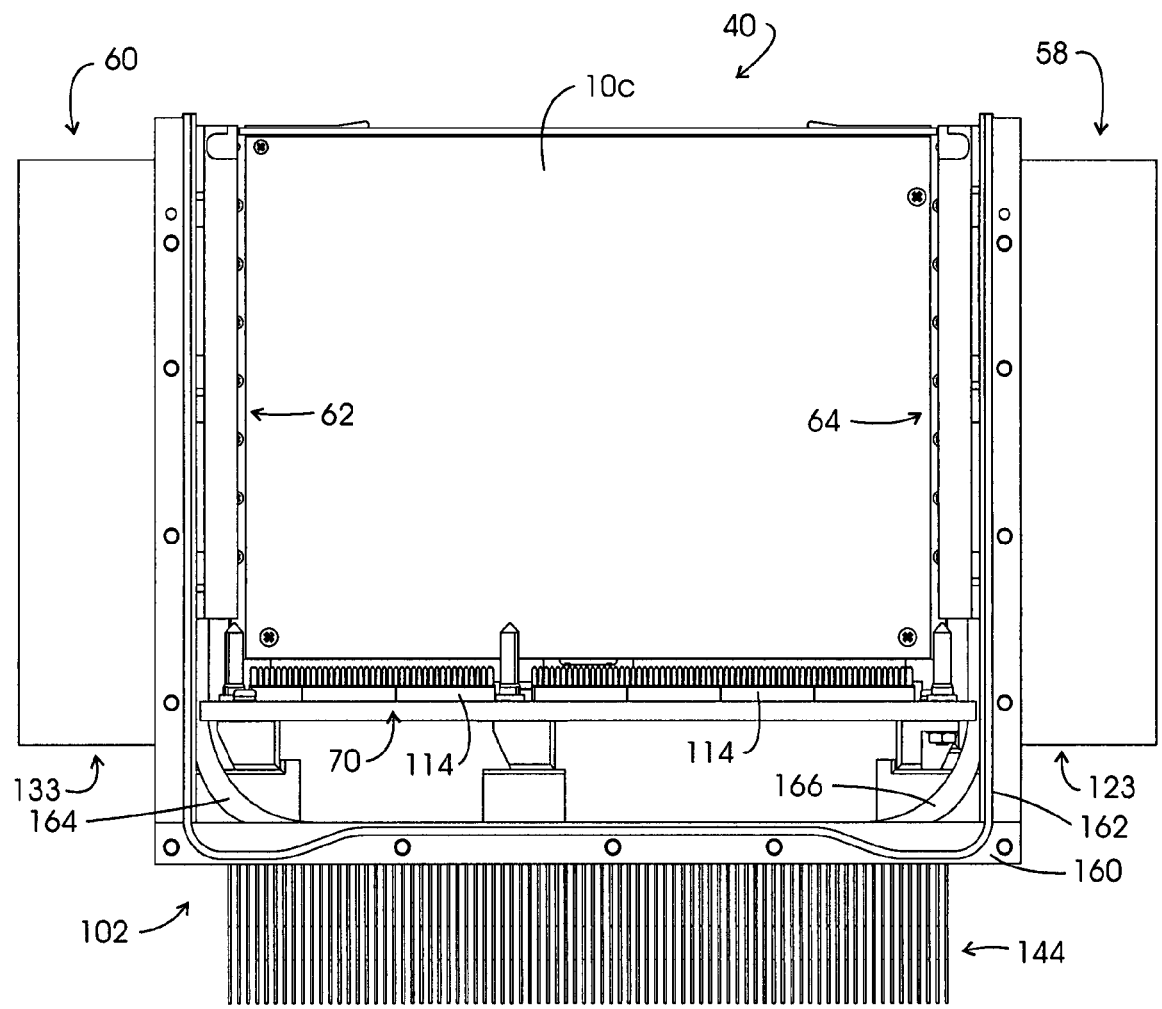
FIG. 14 is a end view looking into the rear portion of the chassis of FIG. 12.

Referring to FIG. 14, a view of the assemblage shown in FIG. 12 looking into rear portion 102 is presented. In the figure, CCA 10c is seen extending to backplane 70. The figure further provides an end view of conduction rail assemblies 62 and 64. Heat sink 123 is shown again at side 58 and heat sink 133 is shown at side 60. Below the backplane 70 there is mounted a thermally conductive billet 160 about which is located a gasket 162. Billet 160 is in mechanical and thermal energy transfer communication with a fifth remote heat sink identified at 144. Heat is transferred from the second to rearwardmost component of conduction rail assembly 62 by a heat pipe as at 164 extending to thermal communication with billet 160. Correspondingly, thermal energy is transferred from the second inwardly disposed component of conduction rail assembly 64 by a heat pipe 166 extending to thermal communication with billet 160.

Figure 15:
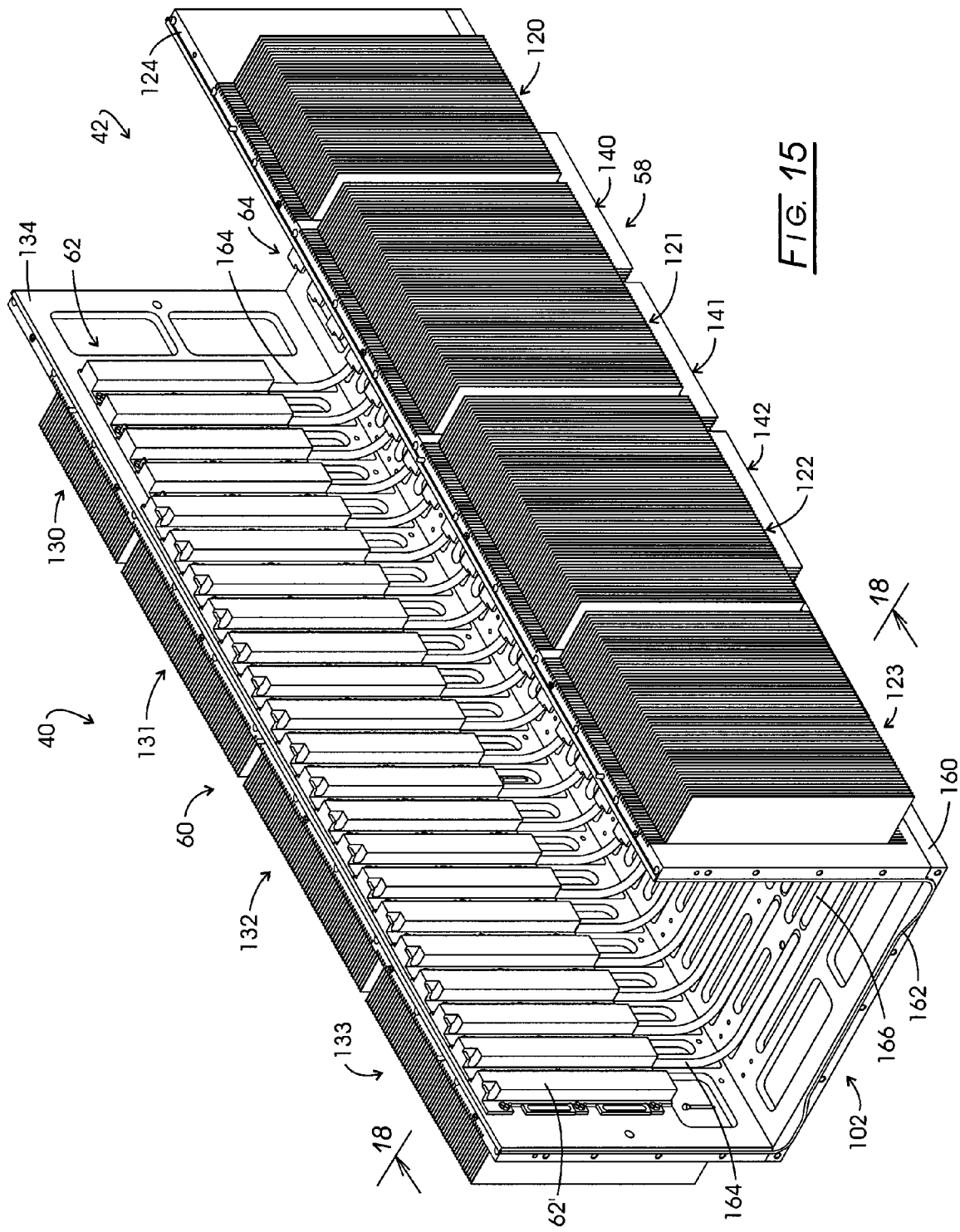
FIG. 15 is a perspective view of the chassis of FIG. 12 with a backplane being removed to reveal internal structure.

Looking to FIG. 15, chassis 40 again appears but with the removal of backplane 70 and CCAs 10a-10c. Heat pipes as at 164 are seen to be internally mounted within the notch defining components of conduction rail assembly 62 and extend to notches of arcuate cross section machined within billet 160. With this arrangement, the thermal energy receiving portions of the heat pipes at 164 and 166 are internally mounted within the conduction rail assembly components while the thermal energy transfer components of the heat pipes as at 164 and 166 are mounted within the noted grooves within billet 160. The heat pipes may be retained within the grooves using a thermally conductive adhesive. Note that one component identified at 62' of conduction rail assembly 62 is not thermally associated with a heat pipe 164. Similarly, the oppositely disposed conduction rail assembly component 64' is not thermally associated with a heat pipe. While the specification for the chassis 40 may call for a capability of dissipating 140 watts, some CCAs will support a function generating relatively lower thermal outputs, for example, an input/output function. Where those thermal outputs are so low, then the heat pipe and remote heat sink systems may not be required.

Figure 16:
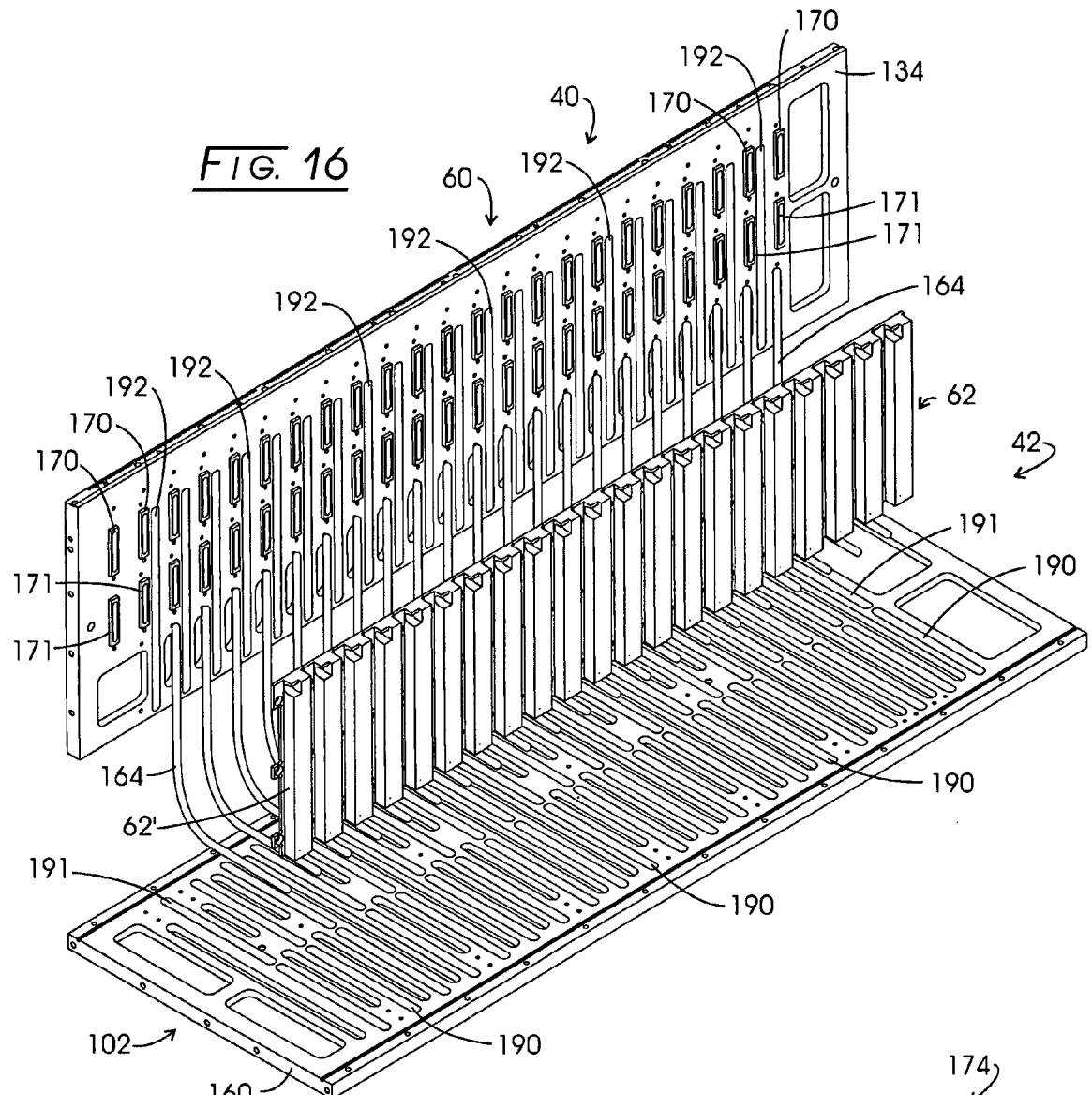
FIG. 16 is a perspective exploded view of the chassis of FIG. 15 with portions removed to reveal internal structure.

Referring to FIG. 16, a partial exploded perspective view of chassis 40 is illustrated; Billet 134 is seen to be machined having a sequence of spaced apart paired buttress components, certain of which are identified at 170 and 171. These buttress components provide lateral support to the individual components of the conduction rail assemblies as at 62. Machined into the inward face of billet 134 is an array of vertical grooves certain of which are identified at 192. These half-cylindrical grooves support the thermal energy receiving portion of heat pipes 164.

Figure 17:
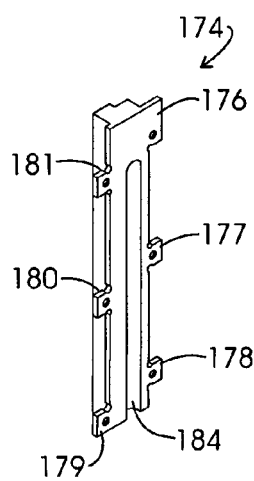
FIG. 17 is a perspective view of a component of a conductive rail assembly shown in FIG. 16.

One component of a conduction rail assemblage incorporating conduction rail assemblage 62 and 64 is represented in general in FIG. 17. This machined part as at 174 is configured with connection flanges as at 176-181 and the inward surface which is attached to the inside surface of billet 134 is seen to be machined to provide a groove of semi-circular cross section serving to support the thermal energy receiving portion of a heat pipe as at 164 or 166.

Returning to FIG. 16, certain of the grooves utilized to retain the heat transferring component of the heat pipes are identified at 190 and 191. As represented in FIG. 14, these grooves 190 and 191 retain the entire diameter of that portion of a heat pipe. This configuration is revealed in FIG. 18. That figure is a partial sectional view taken from FIG. 15 and looking forwardly from rear portion 102. In the figure, the thermal energy receiving portion of a heat pipe 164 is seen extending internally within a cylindrical receiver opening formed of half cylindrical grooves 192 within billet 134 and half cylindrical groove 184 formed within conduction rail assembly 62". The opposite end of heat pipe 164 is seen to extend well within groove 191 within billet 160. In similar fashion, heat pipe 166 is seen to extend internally within a cylindrical receiving chamber formed between component 64" of conduction rail assembly 64 billet 124. In this regard, a half cylindrical groove 184 is shown within component 64" and a corresponding half cylindrical groove 194 is shown formed within billet 124. The lower halves of heat pipes 164 and 166 may be coupled with respective grooves 191 and 190 utilizing a thermally conductive adhesive such as the thermal epoxy adhesive marketed under the trade designation "Thermoset 340" by Lord Chemical Products, Inc. of Indianapolis Ind. A thin layer of thermal grease, for example, marketed under the trade designation "MicroSi G-751" by Shin-Estu MicroSi, Inc. of Phoenix Ariz., may be applied as a thin layer to the receiving cylindrically shaped cavity supporting the thermal energy receiving regions of the heat pipes.

Figure 18:
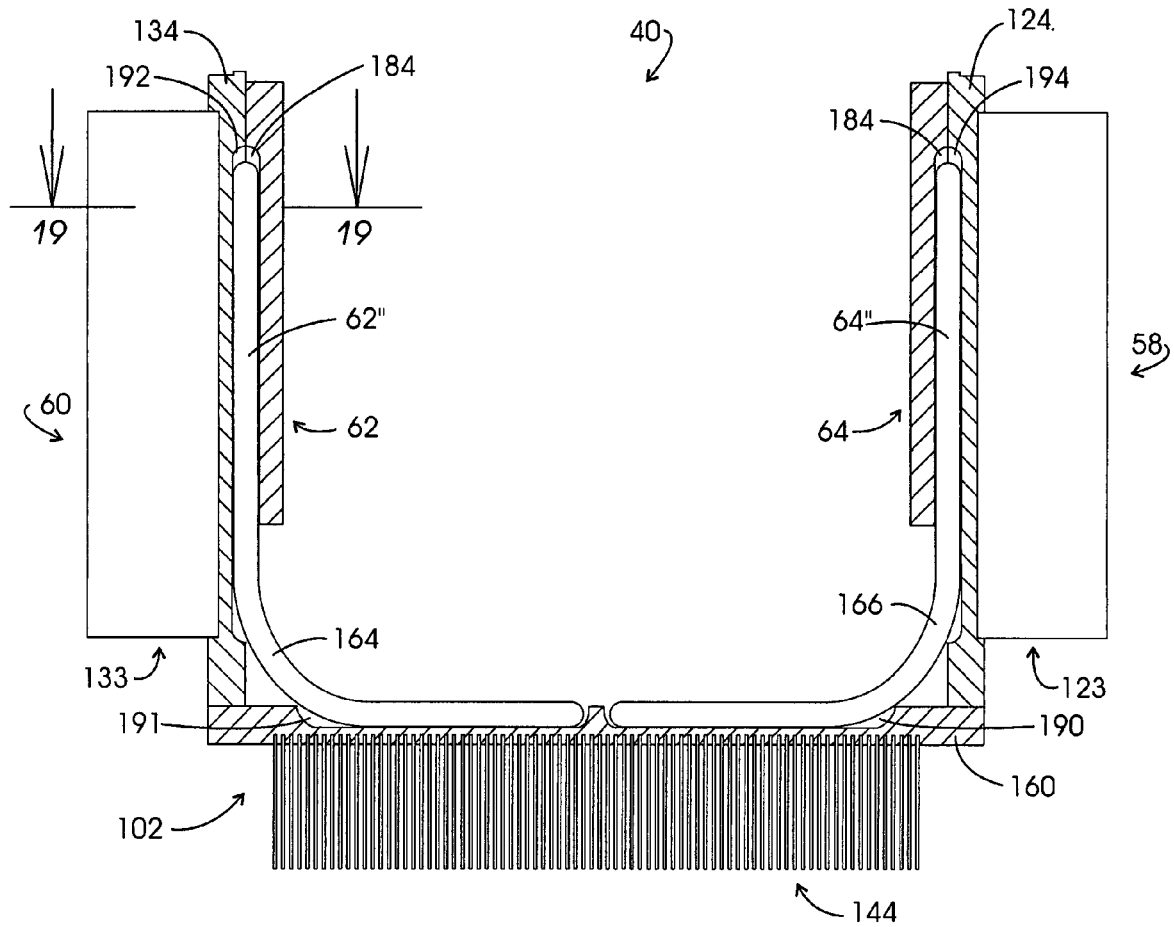
FIG. 18 is a sectional view taken through the plane 18-18 shown in FIG. 15.
Figure 19:
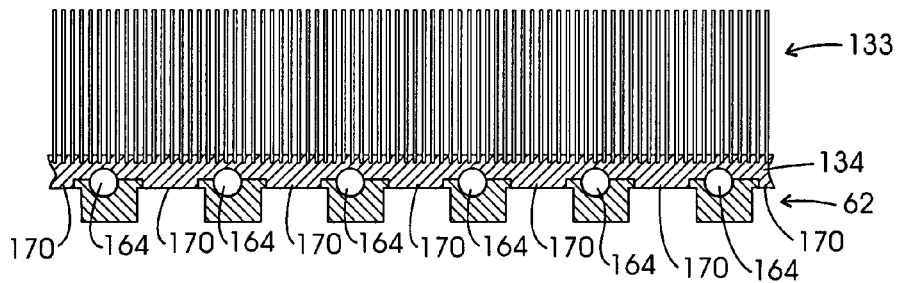
FIG. 19 is a partial sectional view taken through the plane 19-19 shown in FIG. 18.

FIG. 19 is a partial sectional view taken through the plane 19-19 shown in FIG. 18. The figure reveals the machining carried out with respect to billet 134 to form the buttresses 170 described earlier in connection with FIG. 17. The embedding of the heat pipe 164 also is revealed in sectional fashion in the figure.

Figure 20:
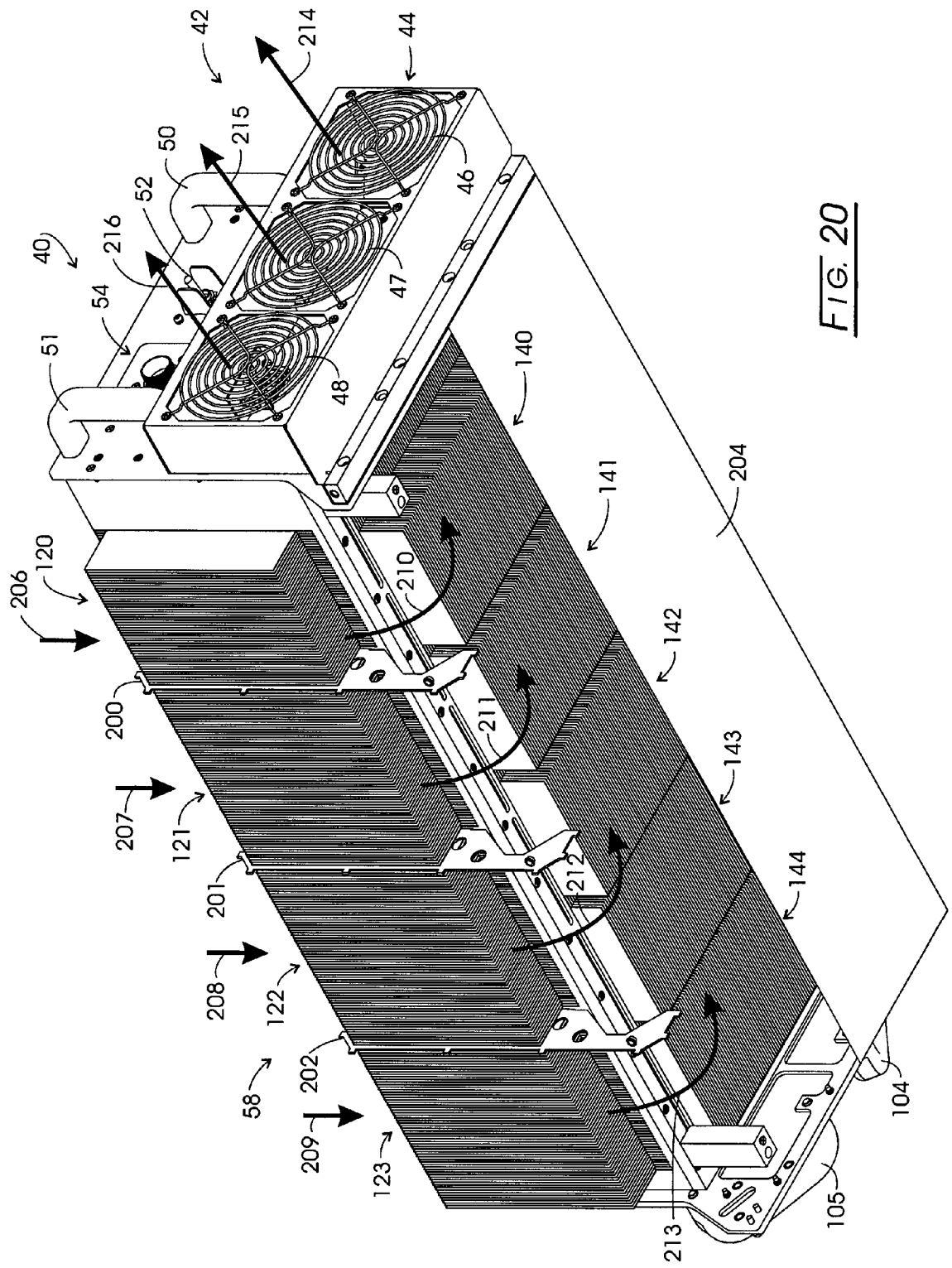
FIG. 20 is a perspective view of the chassis of FIG. 9 illustrating air flow with respect to proximate and remote heat sinks.

Referring to FIG. 20, the five remote heat sinks are depicted and identified at 140-144. Additionally, brackets functioning to support the outer housing shell for side 58 are identified at 200-202. Support tabs on these brackets function to extend through and support the outer housing shell as have been described in connection with FIG. 6 at 110. An identical arrangement of brackets is provided for side portion 60 of chassis 40. The air flow path for chassis 40 is essentially defined by the outer housing shell, one half of the lower or bottom housing shell being represented at 204. An air flow path which is preferred is represented in the figure by arrows. In this regard, arrows 206-209 depict ambient air entry at the top region of chassis 40. This entry is provided at both side portion 58 as shown and side portion 60 (not shown). It may be recalled that such entry of air is through orifice arrays 78a-78d for side portion 58 and 76a-76d for side portion 60 as represented in FIG. 5. Upon passing through proximate heat sinks as at 120-123, as represented by arrows 210-213, the air flow then passes through the remote heat sinks 140-144. In similar fashion, air will pass through proximate heat sinks 130-133 and then through remote heat sinks 140-144. This air flow is developed by fans 46-48 as represented at arrows 214-216. For normal terrestrial operation, only two of these fans are required. However, by adding a third fan, performance up to 10,000 feet in altitude is made available. While it is feasible that the fans 46-48 may push air flow into chassis 40, that arrangement would cause the ambient air to pass through the secondary or remote heat sinks first before encountering the proximate heat sinks which are the most efficient thermal exchange devices. The fans 46-48 may be the same as that described at 90 in FIG. 4. Note that there are only three fans functioning to provide requisite air flow. This is because of the utilization of the remote heat sinks 140-144 and the associated heat pipe technology. Recall that without this heat pipe and remote heat sink technology, fourteen such fans would be called for which still would not meet the heat dissipation requirements set forth above. Table 1 above can now be embellished as shown in Table 2 below where three pitches are identified and the CCA cooling capacities in watts for remote heat sink technology are set forth. Note that for the instant pitch value 1.2 inch, remote heat sink technology (RHT) permits from about 205 to 235 watt heat dissipation. It also should be noted that because of the value of that pitch, the thermal energy receiving portions of the heat pipe could be embedded in the conduction rail assemblies as described.

TABLE 2

Figure 21:
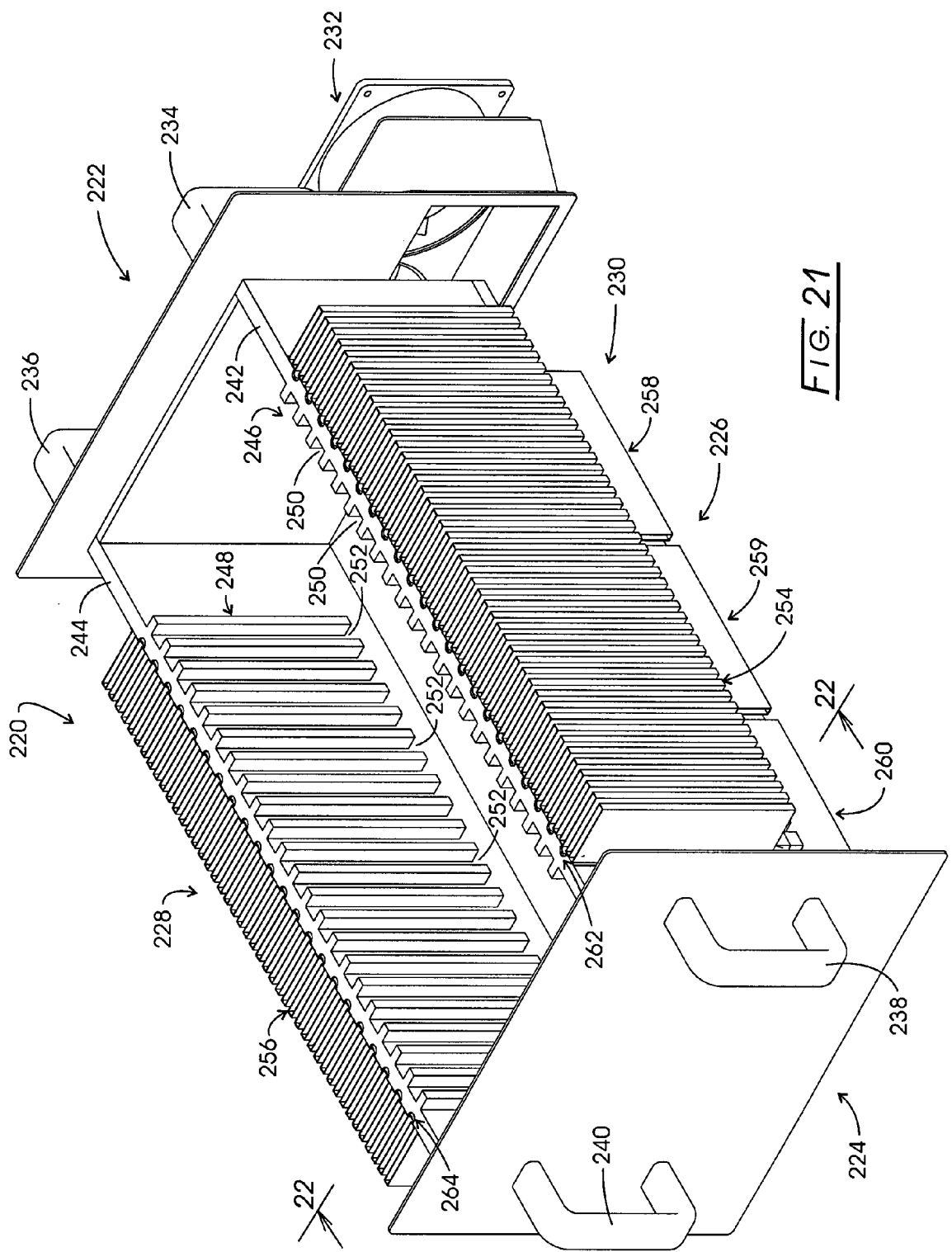
FIG. 21 is a perspective view of another chassis architecture with portions removed to reveal internal structure.

| | CCA Cooling Capacity (W) | | |
|---|---|---|---|
| Pitch | Theoretical | Real-Fan | RHT |
| 0.8" | 98 | 86 | 130-140 |
| 1.2" | 164 | 136 | 205-235 |
| 1.4" | 190 | 157 | 235-250 |

Where the chassis and associated CCA design calls for the utilization of a smaller 0.8 inch pitch, then there is inadequate space to carry out the embedding of the thermal energy receiving portions of the heat pipes between card slots. Referring to FIG. 21, a chassis represented generally at 220 is shown to be configured to perform with CCAs arranged in a 0.8 inch pitch. Chassis 220 includes a front portion 222, a rear portion 224, side portions 226 and 228 and a lower region 230. A fan mount is represented generally at 232 at front portion 222 along with hand grips 234 and 236. Hand grips 238 and 240 are located at rear portion 224.

Chassis 220 is configured with an assemblage of oppositely disposed conduction rail assemblies, herein machined as integrally formed within the inward faces of billets. In this regard, a billet 242 is located at side portion 226 and a billet 244 is located at side portion 228. Billet 242 is inwardly machined to define a conduction rail assembly represented generally at 246 and billet 244 is machined to provide a conduction rail assembly represented in general at 248. Assembly 246 is configured to provide twenty-one card slots, certain of which are identified at 250, while assembly 248 is configured with corresponding card slots, certain of which are identified at 252. A proximate heat sink represented generally at 254 is shown at side portion 226, while a corresponding proximate heat sink 256 identified with side 228. As in the case of chassis 40, thermal energy is conducted from the card slots 250 and 252 to be initially dissipated at these proximate heat sinks 254 and 256. Located within the lower region 230 and below a backplane (not shown) are three remote heat sinks represented generally at 258-260. To accommodate to the narrow pitch at hand, the outboard surface of billet 242 is machined having grooves suited to receive the thermal energy reception portion of a heat pipe in thermal energy transfer relationship. An array of heat pipes and associated vertical grooves of arcuate cross section is represented at 262 extending from front portion 222 toward rear portion 224. In similar fashion, the outboard side of billet 244 is machined with vertical grooves for nestably receiving the thermal energy reception portions of heat pipes. An array of these heat pipes and associated grooves is represented in general at 264.

Figure 22:
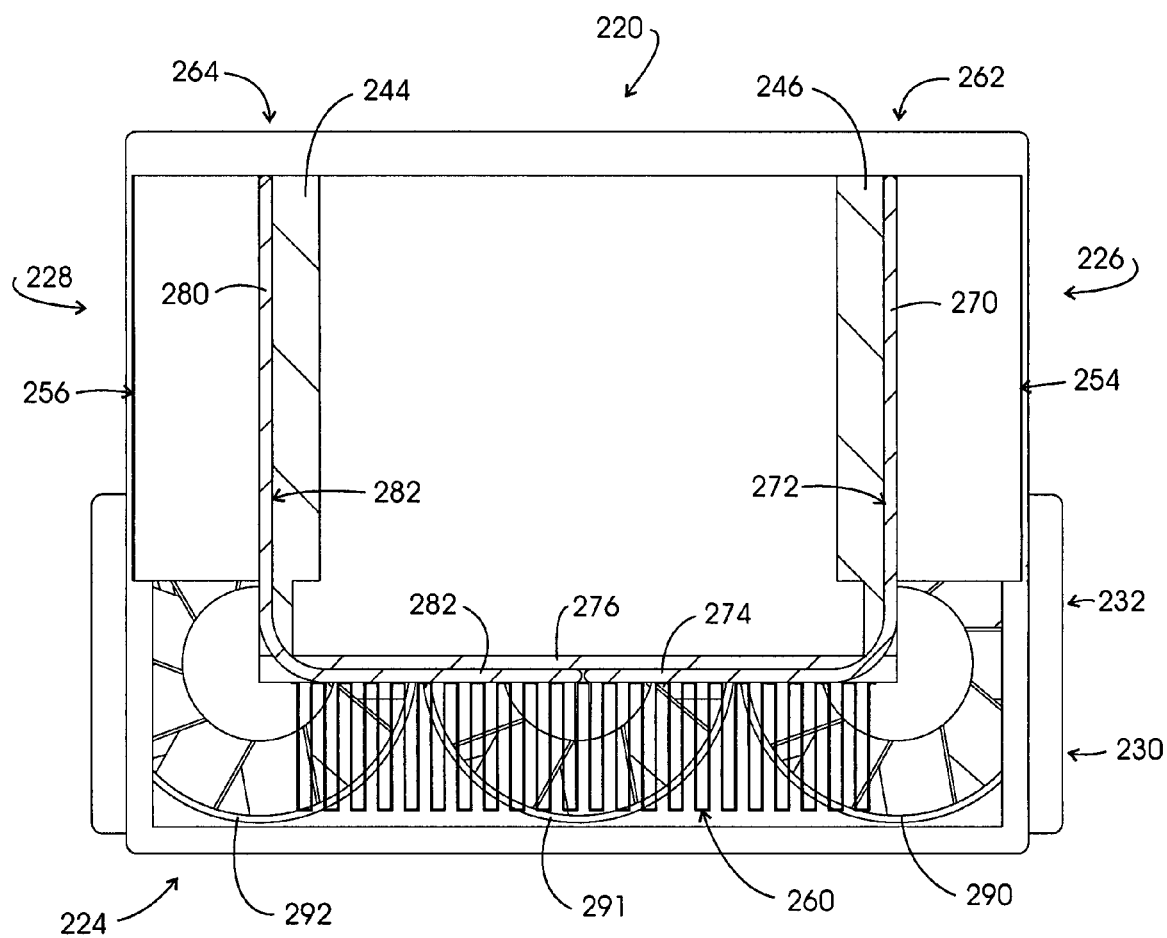
FIG. 22 is an end view of the chassis of FIG. 21.

Looking to FIG. 22, a view of chassis 220 looking inwardly from rear portion 224 is provided. In the figure, the upper or thermal energy receiving portion 270 of a heat pipe represented generally at 272 of the array 262 is shown embedded within a groove within billet 246. Heat pipe 272 is bent to an extent of 90° to locate its thermal energy transferring portion 274 into a lower billet 276. Note that the groove within billet 276 receiving heat pipe portion 274 will be formed within its underside.

In similar fashion, the thermal energy receiving portion 280 of a heat pipe represented generally at 282 within array 264 is embedded within a vertical groove formed within billet 244 and secured with a thermally conductive adhesive. Heat pipe 282 is bent to an extent 90° such that its thermal energy portion 284 is nestably located within a groove formed within the lower surface of lower billet 276. Heat pipe 282 is secured utilizing a thermally conductive adhesive. The remote heat sinks such as that shown at 260 are coupled in thermal energy transfer relationship with lower billet 276 over the heat pipe portions as identified at 274 and 284. An air flow path of chassis 220 is established by three fans 290-292 within fan mount 232. The air flow path for chassis 220 is essentially the same as that described in connection with chassis 40 in connection with FIG. 20.

Figure 23:
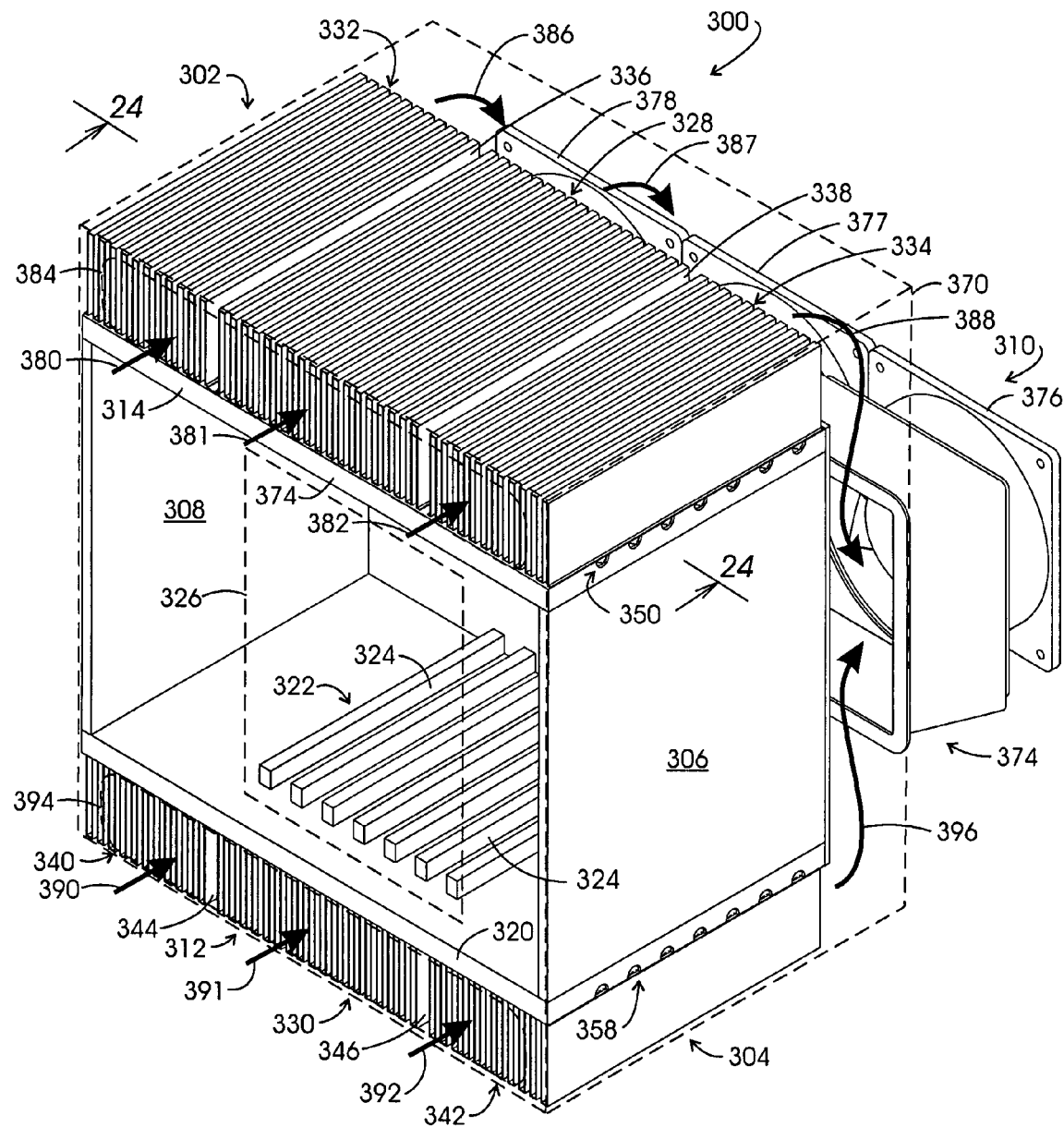
FIG. 23 is a perspective view of another chassis with portions removed to reveal internal structure and showing air flow paths.
Figure 24:
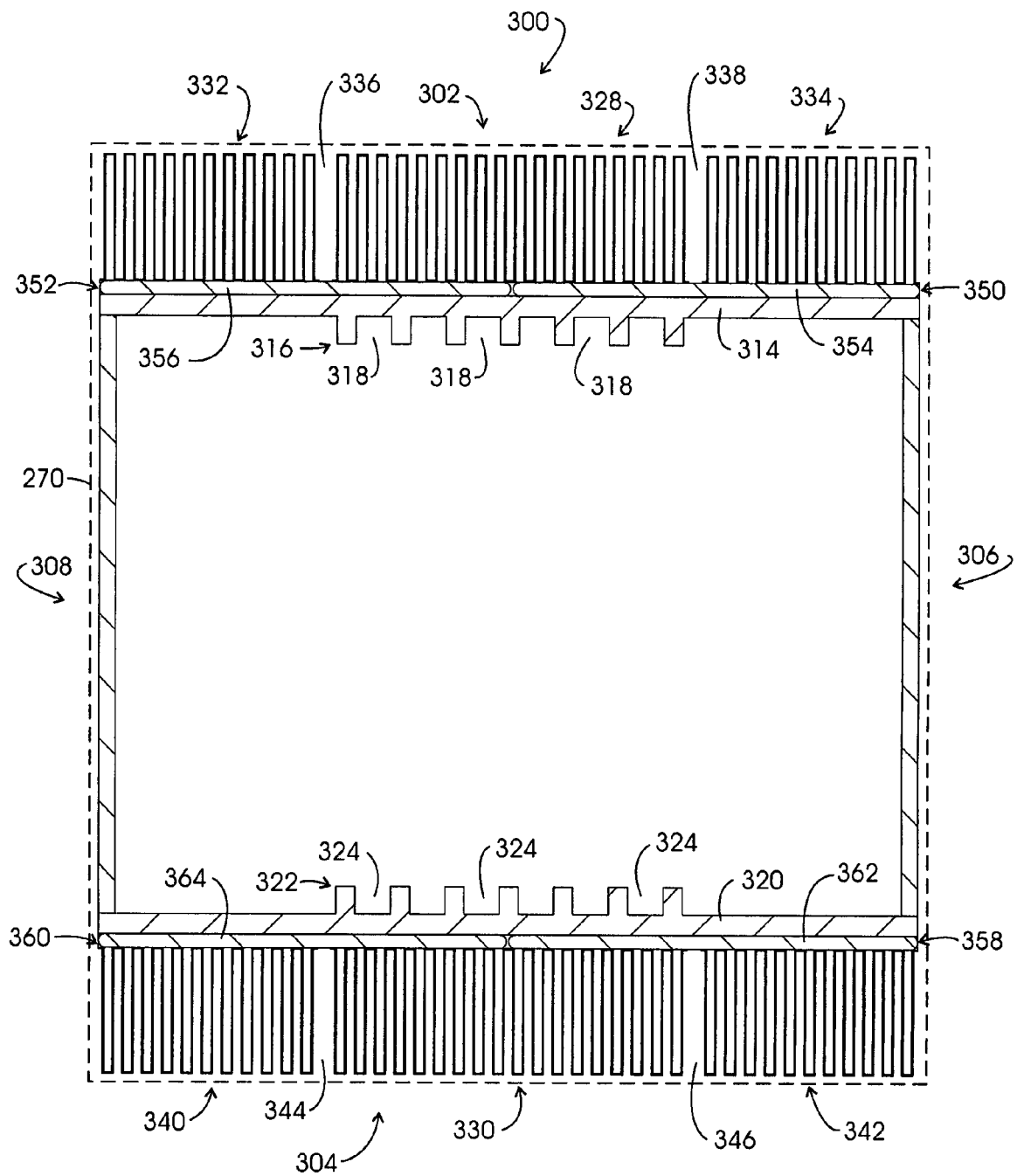
FIG. 24 is an end sectional view taken through the plane 24-24 in FIG. 23.

Another chassis architecture employing remote heat sink and heat pipe technology is identified in general at 300 in FIGS. 23 and 24. Looking to FIG. 23, chassis 300 is shown having a top portion represented generally at 302; a bottom portion represented generally at 304; oppositely disposed side portions shown generally at 306 and 308 extending between front and rear portions represented respectively in general at 310 and 312. Top portion 302 supports a thermally conductive billet 314 which is configured, as seen in FIG. 24 with a conduction rail assembly represented generally at 316 having card slots, certain of which are identified at 318.

Looking additionally at FIG. 23, bottom portion 302 is configured with a billet 320 which is machined to provide a conduction rail assembly represented generally at 322 incorporating card slots 324. Note that the conduction rail assemblies 316 and 322 are mutually aligned and centrally disposed within the chassis 300. In particular, as seen in FIG. 23, they are aligned with a centrally disposed backplane represented in phantom at 326. Additionally, these components are seen to be spaced from the side portions 306 and 308. Billet 314 at top portion 302 is seen to support a finned proximate heat sink shown generally at 328. Note that proximate heat sink 328 is aligned and coextensive with conduction rail assembly 316 and backplane 326.

In similar fashion, billet 320 at bottom portion 304 mechanically supports a proximate heat sink represented generally at 330 and is coupled thereto in thermal energy transfer relationship. With the arrangement, the assemblage of conduction rail assemblies 316 and 322 are aligned with the proximate heat sinks 328 and 330.

The remote heat sinks provided with chassis 300 are located in adjacency with the proximate heat sinks at top portion 302 and bottom portion 304. In this regard, remote heat sinks 332 and 334 are mechanically supported by billet 314 at either side of proximate heat sink 328, a slight gap being present with respect to this adjacency as seen at 336 and 338.

In similar fashion, remote heat sinks 340 and 342 are located in adjacency with proximate heat sink 330 at bottom portion 304. These remote heat sinks are mechanically supported by billet 320 and are seen to be spaced from the proximate heat sink 330 by gaps 344 and 346. Gaps 336, 338, 344 and 346 serve to locate the remote heat sinks generally without the thermal influence of the centrally disposed proximate heat sinks.

Thermal energy is transferred from the conduction rail assemblies to the remote heat sinks by arrays of heat pipes which extend nestably within grooves formed within the billets from a location over the middle of a conduction rail assembly to extend beneath the remote heat sinks. In this regard, FIG. 23 reveals an array 350 of heat pipes located within grooves machined within the upper surface of billet 314. These heat pipes of array 350 extend to a location about half way across conduction rail assembly 316 (FIG. 24). A similar heat pipe array represented in general at 352 in FIG. 24 extends from side 308 to about the midpoint of conduction rail assembly 316. FIG. 24 reveals a heat pipe 354 within array 350 and a heat pipe 356 within array 352.

In similar fashion, FIG. 23 reveals an array 358 of heat pipes extending from a location generally at the center of conduction rail assembly 322 to a location under the end of remote heat sink 332. A similar array of heat pipes is represented in general at 360 in FIG. 24 extending from the end of remote heat sink 340 to about the center of conduction rail assemblies 322. That figure identifies one heat pipe of array 358 at 362 and one heat pipe of array 360 at 364. In general, the heat pipes are affixed within the billet carrying grooves utilizing a thermally conductive adhesive.

FIG. 23 reveals an outline in phantom identifying the location of the outer housing of chassis 300 at 370. Within that outline, an air flow path can be identified as it is associated with a fan mount represented at 374 carrying three fans 376-378. These fans at mount 374 draw air through entrance ports for simultaneous air flow contact and thermal energy exchange with both the proximate and remote heat sinks. For instance, as represented at arrows 380-382 air is drawn through an entrance port represented in phantom at 384 to flow in thermal exchange relationship across proximate heat sink 328 and remote heat sinks 332 and 334 to descend and be expelled from fan mount 374. This arrangement is represented by arrows 386-388.

Similarly, arrows 390-392 represent the flow of air through an entrance port shown in phantom at 394 and across proximate heat sink 330 and remote heat sinks 340 and 342. The air exits these heat sinks into fan mount 374 as represented by the single arrow 396.

Figure 25:
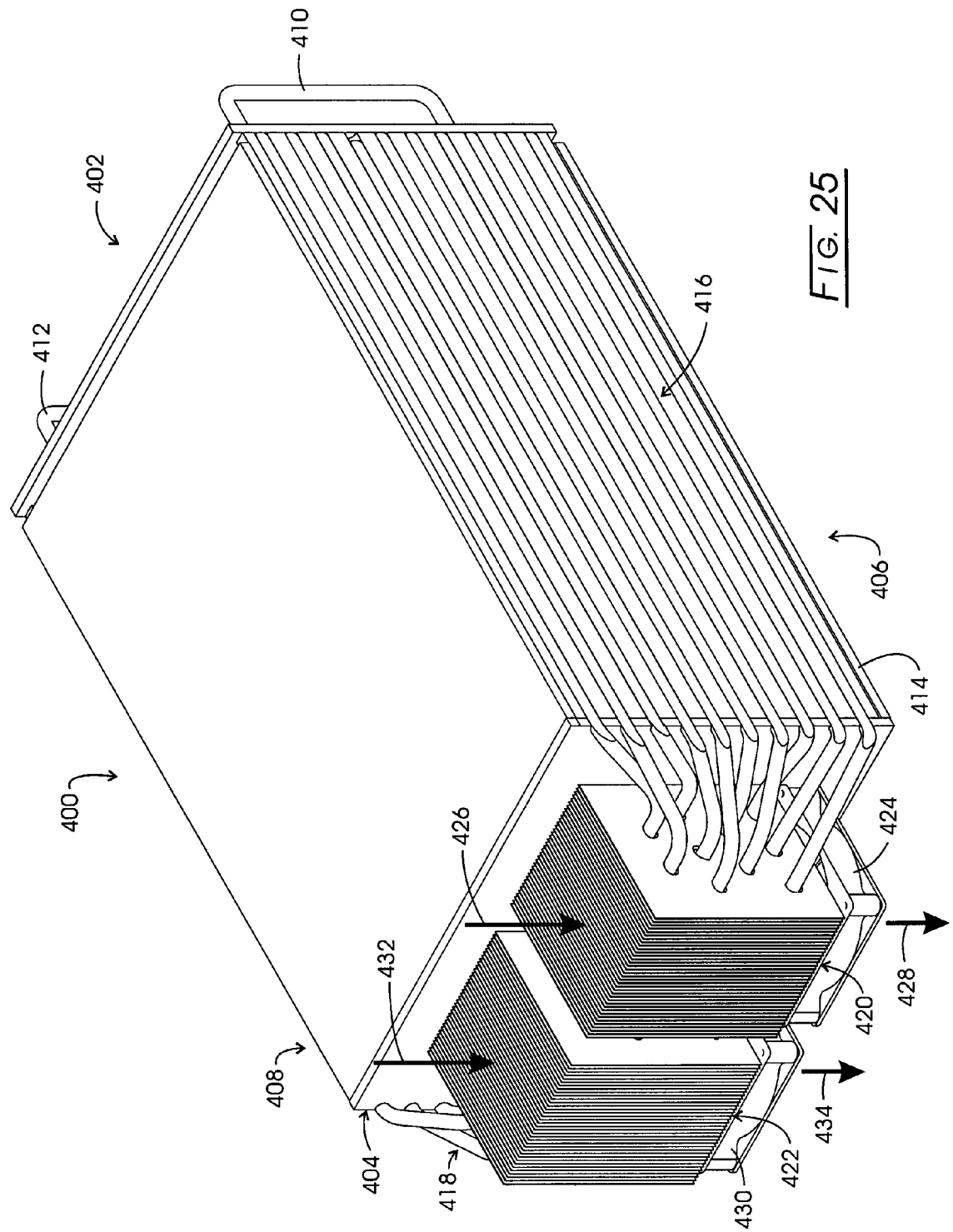
FIG. 25 is a perspective view of another chassis showing rearwardly mounted remote heat sinks.

Referring to FIG. 25, a chassis is represented in perspective fashion and identified generally at 440. A chassis front portion is represented generally at 402; a rear portion is represented generally at 404 and oppositely disposed side portions are represented generally at 406 and 408. Chassis 440 is configured generally in the manner of chassis 220 described in connection with FIGS. 21 and 22. However, no proximate heat sink assemblies are located at side portions 406 and 408. Front portion 402 is seen to incorporate hand grips 410 and 412. Each of the side portions are configured with a billet as shown, for example, at 414 with respect to side portion 406. These billets as at 414 are configured having externally machined elongate horizontal grooves which extend from front portion 402 to rear portion 404. Those horizontal grooves nestably retain an array of elongate heat pipes as represented at in general at 416 and 418. The heat pipes are bent around the rear portion 418 of chassis 440 into thermal energy exchange relationship and engagement with remote heat sinks. For example, heat pipe array 416 is seen to extend into such engagement with a remote heat sink represented generally at 420. Similarly, the array 418 of heat pipes from side portion 408 extends into thermal energy exchange engagement with a remote heat sink represented generally at 422. A fan 424 is located at the underside of remote heat sink 420 and creates an air flow represented by arrows 426 and 428. In similar fashion, a fan 430 is located at the underside of remote heat sink 422 and provides for an air flow represented at arrows 432 and 434.

This arrangement of chassis 440 permits a significant lessoning of the widthwise extent of chassis 440 while extending its length.

Since certain changes may be made in the above system and method without departing from the scope hereof, it is intended that all matter contained in the above description or shown in the accompanying drawings shall be interpreted as illustrative and not in a limiting sense.

The invention claimed is:

1. The method for dissipating thermal energy from an assemblage of conduction-cooled circuit card assemblies each having oppositely disposed edge regions at least one of which is configured for the conductive transfer of thermal energy, comprising the steps:

providing a chassis configured having a backplane assembly with connectors for operative connection with said assemblage of conduction cooled circuit card assemblies;

providing an assemblage of oppositely disposed conduction rail assemblies located with respect to said backplane assembly having card guide slots to receive the oppositely disposed edge regions of said conduction-cooled circuit card assemblies and retain them in a card pitch defined sequence;

locating said assemblage of conduction-cooled circuit card assemblies by positioning the oppositely disposed edge regions of each within a card slot and operatively connecting it with a corresponding backplane assembly connector;

compressibly engaging at least one edge region of each conduction-cooled circuit card assembly in conductive thermal transfer relationship with an operationally associated conduction rail assembly, said assemblage of conduction-cooled circuit card assemblies defining a given thermal load conductively transferable to said assemblage of conduction rail assemblies;

providing one or more remote heat sink assemblies configured for the transfer of thermal energy to a flow of air and supported by said chassis at a location remote from said thermal load;

providing an assemblage of heat pipes mounted with said chassis in thermal transfer relationship between said assemblage of conduction rail assemblies and said one or more remote heat sink assemblies, said assemblage of heat pipes and said one or more remote heat sink assemblies being configured to transfer at least a portion of said thermal load to said one or more remote heat sink assemblies;

providing one or more proximate heat sink assemblies configured for the transfer of thermal energy to a flow of air, supported by said chassis at a location or locations establishing a conductive thermal transfer relationship with all or a portion of said assemblage of conduction rail assemblies, said one or more proximate heat sink assemblies and said one or more remote heat sink assemblies being configured in concert to effect the transfer of said thermal load to flowing air;

flowing air in thermal transfer relationship with the one or more proximate heat sink assemblies to disperse thermal energy therefrom; and flowing air in thermal transfer relationship with the one or more remote heat sink assemblies to disperse thermal energy therefrom.

2. The method of claim 1 in which:

said steps of flowing air in heat transfer relationship are carried out using a common fan assemblage mounted with said chassis.

3. The method of claim 1 in which:
said step providing a chassis locates the backplane in a lower region of it; and
said step providing one or more remote heat sink assemblies supported by said chassis locating one or more remote heat sinks beneath the backplane.

4. The method of claim 1 further comprising the steps:
determining geometric limiting dimensions for providing said chassis;
based upon the parameters comprising said pitch, a practical available air velocity, an air pressure of the flowing air, an air-to-rail differential temperature, an optimal fin length, height and density, determining an optimized proximate heat sink structure and its capability for optimally dissipating all or a portion of said given thermal load; and
altering one or more said optimized proximate heat sink structures to conform to the requirements of said geometric limiting dimensions.

5. The method of claim 4 further comprising the steps:
determining the thermal energy dissipating capability of the altered proximate heat sink structures and the remaining thermal load portion not dissipated thereby; and
said one or more remote heat sink assemblies are configured to dissipate at least said remaining thermal load.

6. The method of claim 4 in which:
said assemblage of heat pipes are provided in thermal transfer relationship only with those conduction rail assemblies exhibiting a thermal energy condition not dissipated by said proximate heat sink assemblies.

7. The method of claim 1 in which:
the thermal energy receiving portions of heat pipes of said assemblage are mounted in thermal transfer relationship internally within said conduction rail assemblies where said pitch provides adequate space.

8. The method of claim 1 in which:
the thermal energy receiving portions of the heat pipes of said assemblage are mounted in thermal transfer relationship externally upon said conduction rail assemblies where said pitch exhibits a spacing between card guide slots inadequate to receive the thermal energy receiving portions.

9. The method of claim 1 in which:
said chassis is provided having front and rear portions with sides extending between them each provided as an external surface of said assemblage of conduction rail assemblies;
said one or more remote heat sink assemblies are supported by said chassis adjacent said rear portion; and
the thermal energy receiving portions of the heat pipes of said assemblage are mounted in thermal transfer relationship with said chassis sides.

10. The method of claim 1 in which:
said chassis is provided with top and bottom portions and oppositely disposed side portions extending between front and rear portions, said backplane being disposed centrally adjacent said rear portion and spaced from said side portions;
said assemblage of oppositely disposed conduction rail assemblies are provided at said top and bottom portions in general alignment with said backplane;
said one or more proximate heat sink assemblies are located centrally in general alignment with said conduction rail assemblies; and
said one or more remote heat sink assemblies are located at said chassis top and bottom portions in general adjacency with said proximate heat sinks.

11. A system for operatively supporting an assemblage of conduction-cooled circuit card assemblies each having oppositely disposed edge regions configured for the conductive transfer of thermal energy, comprising:
a chassis having oppositely disposed sides extending between end portions;
a backplane within said chassis having a pitch defining sequence of backplane connectors;
an assemblage of oppositely disposed conduction rail assemblies located with respect to said backplane, having card slots in pitch-defining relationship with said backplane connectors configured to receive a thermal load defining sequence of said conduction-cooled card assemblies by heat conducting contact with said edge regions;
one or more remote heat sink assemblies configured for the transfer of thermal energy to a flow of air and supported at said chassis at a location generally without the influence of heat at the conduction rail assemblies;
an assemblage of heat pipes mounted with said chassis in heat transfer relationship between said assemblage of conduction rail assemblies and said one or more remote heat sink assemblies configured to transfer at least a portion of said thermal load to the one or more remote heat sink assemblies; and
one or more proximate heat sink assemblies configured for the transfer of thermal energy to a flow of air, supported by said chassis at a location or locations establishing a conductive heat transfer relationship with said assemblage of conduction rail assemblies, said one or more proximate heat sink assemblies and said one or more remote heat sink assemblies being configured in concert to effect the transfer of said thermal load to flowing air.

12. The system of claim 11 further comprising:
a source of fan derived flowing air mounted with the chassis at a location effecting thermal transfer to said flowing air from said one or more remote heat sink assemblies.

13. The system of claim 11 in which:
said chassis is configured having a bottom region and a top region;
said backplane is supported at said bottom region;
said one or more remote heat sink assemblies are mounted within said chassis generally below said backplane;
said chassis is configured defining an air flow path extending between said top region across the one or more proximate heat sink assemblies, across the one or more remote heat sink assemblies and a chassis end portion; and
further comprising:
a fan assemblage supported at a said end portion in air flow communication with said air flow path and configured to establish an air flow along said path exhibiting a velocity effective to disperse said thermal load.

14. The system of claim 13 in which:
said pitch is of a length adequate to locate each heat pipe within the chassis between adjacent card slots; and
each heat pipe is mounted between adjacent card slots.

15. The system of claim 14 in which:
each heat pipe of the assemblage of heat pipes is configured having a thermal energy receiving portion extending internally within a conduction rail assembly and is bent to extend an opposite thermal transfer portion internally within the chassis below the backplane into thermal transfer engagement with a remote heat sink assembly.

16. The system of claim 13 in which:

said pitch is of a length inadequate to locate each heat pipe within the chassis between adjacent card slots; and each heat pipe is mounted in thermal transfer relationship at an outwardly disposed surface of said assemblage of conduction rail assemblies.

17. The system of claim 14 in which:

said one or more proximate heat sink assemblies are located over the assemblage of heat pipes.

18. The system of claim 16 in which:

each heat pipe of the assemblage of heat pipes is configured having a thermal energy receiving portion mounted with said outwardly disposed surface of a conduction rail assembly and is bent to extend an opposite thermal transfer portion into the chassis below the backplane into thermal transfer engagement with a remote heat sink assembly.

19. The system of claim 11 in which:

said one or more remote heat sink assemblies are supported by the chassis at one end portion outwardly from the assemblage of conduction rail assemblies; and said assemblage of heat pipes extend along the oppositely disposed sides of the chassis from conductive thermal engagement with the assemblage of oppositely disposed conduction rail assemblies to the one or more remote heat sink assemblies.

20. The system of claim 19 further comprising:

a source of fan derived moving air supported by the chassis at a location adjacent said one or more remote heat sink assemblies and defining an air flow path extending generally vertically across the one or more remote heat sink assemblies.

21. The system of claim 11 in which:

said chassis is configured having top and bottom portions and oppositely disposed side portions extending between front and rear portions;

said backplane is disposed centrally adjacent said rear portion and spaced from said side portions;

said assemblage of oppositely disposed conduction rail assemblies is located at said top and bottom portions in general alignment with said backplane;

said one or more proximate heat sink assemblies are located centrally in general alignment with said conduction rail assemblies; and said one or more remote heat sink assemblies are located at said chassis top and bottom portions in general adjacency with said proximate heat sinks.

22. The system of claim 21 in which:

each heat pipe is mounted in thermal transfer relationship at an outwardly disposed surface of the assemblage of conduction rail assemblies.

23. The system of claim 21 in which:

said chassis is configured to define an air flow path extending between said front portion, across said proximate and remote heat sink assemblies and said rear portion; and further comprising:

a fan assemblage supported at said front or rear portion in air flow communication with said air flow path and configured to establish an air flow along said path exhibiting a velocity effective to disburse said thermal load.

* * * * *